US012663160B2

(12) United States Patent
Kim et al.

(10) Patent No.: US 12,663,160 B2
(45) Date of Patent: Jun. 23, 2026

(54) ELECTRIC RANGE

(71) Applicant: LG ELECTRONICS INC., Seoul (KR)

(72) Inventors: Mijung Kim, Seoul (KR); Junghyeon Cho, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 982 days.

(21) Appl. No.: 17/826,404

(22) Filed: May 27, 2022

(65) Prior Publication Data

US 2022/0381443 A1    Dec. 1, 2022

(30) Foreign Application Priority Data

May 28, 2021    (KR) ........................ 10-2021-0069402

(51) Int. Cl.
| | |
|---|---|
| *F24C 15/00* | (2006.01) |
| *H05B 11/00* | (2006.01) |
| *H05K 1/02* | (2006.01) |
| *H05K 7/20* | (2006.01) |

(52) U.S. Cl.
CPC ............ *F24C 15/006* (2013.01); *H05B 11/00* (2013.01); *H05K 1/0203* (2013.01); *H05K 7/20145* (2013.01); *H05K 7/2039* (2013.01)

(58) Field of Classification Search
CPC ...... F24C 15/006; F24C 15/101; H05B 11/00; H05B 6/1263; H05B 6/1209; H05K 1/0203; H05K 7/20145; H05K 7/2039; H05K 7/20172; H05K 7/20509; Y02B 40/00
See application file for complete search history.

(56) References Cited

U.S. PATENT DOCUMENTS

| | | |
|---|---|---|
| 9,867,237 B2 | 1/2018 | Matsui et al. |
| 2010/0219179 A1 | 9/2010 | Lin |

(Continued)

FOREIGN PATENT DOCUMENTS

| | | |
|---|---|---|
| DE | 10 2013 107090 | 1/2015 |
| EP | 3 503 674 | 7/2020 |

(Continued)

OTHER PUBLICATIONS

European Search Report issued in Application No. 22176046.5 dated Oct. 18, 2022.

(Continued)

*Primary Examiner* — Robert G Bachner
(74) *Attorney, Agent, or Firm* — KED & ASSOCIATES

(57) ABSTRACT

An electric range is provided that may include a case, a cover plate coupled to an upper side of the case and on which an object to be heated is placed, at least one heater that heats the object, the at least one heater being disposed under the cover plate, an upper bracket that is disposed under the at least one heater and supports the at least one heater, a base bracket disposed under the upper bracket and on which a printed circuit board is mounted, a heat sink mounted on the printed circuit board, an air blowing fan that is mounted on the base bracket and discharges air toward the heat sink through an outlet thereof, and an air guide that communicates with the air blowing fan, surrounds the heat sink, and forms a flow path of air cooling the heat sink.

19 Claims, 13 Drawing Sheets

(56)     References Cited

U.S. PATENT DOCUMENTS

| | | | |
|---|---|---|---|
| 2012/0006811 A1 * | 1/2012 | Matsui ................. | H05B 6/1263 |
| | | | 219/623 |
| 2016/0323938 A1 * | 11/2016 | Leonardi .............. | H05B 6/1263 |
| 2017/0347406 A1 | 11/2017 | Cha | |
| 2019/0306928 A1 | 10/2019 | Choi et al. | |
| 2020/0154598 A1 | 5/2020 | Kim et al. | |

FOREIGN PATENT DOCUMENTS

| | | |
|---|---|---|
| KR | 10-1307594 | 9/2013 |
| KR | 10-2017-0133937 | 12/2017 |
| KR | 10-2018-0013592 | 2/2018 |
| KR | 10-2019-0113072 | 10/2019 |
| KR | 10-2020-0053119 | 5/2020 |

OTHER PUBLICATIONS

Korean Office Action dated Jul. 10, 2025, issued in Application No. 10-2021-0069402.
Korean Notice of Allowance dated Mar. 3, 2026.

* cited by examiner

80

80

ELECTRIC RANGE

CROSS-REFERENCE TO RELATED APPLICATION(S)

This application claims priority to and benefit of Korean Patent Application No. 10-2021-0069402, filed in Korea on May 28, 2021, which is hereby incorporated by reference as when fully set forth herein.

BACKGROUND

1. Field

An electric range, and in particular, an electric range having a structure capable of effectively cooling an inside of the electric range is disclosed herein.

2. Background

Details in the background section do not constitute prior art but are given only as background information concerning the subject matter of the present disclosure.

Various types of cooking appliances are used to heat food or other items (hereinafter, collectively "food") at homes or restaurants. The cooking appliances include gas ranges using gas and electric ranges using electricity.

The electric ranges are classified as resistance heating-type electric ranges and induction heating-type electric ranges. In terms of electrical resistance heating, electric current is supplied to a metallic resistance wire or a non-metallic heat generating element, such as silicon carbide, to generate heat, and the generated heat is radiated or conducted to heat an object to be heated, for example, a cooking container, such as a pot, or a frying pan, for example.

In terms of induction heating, high-frequency power is supplied to a coil to generate a magnetic field around the coil, and eddy current produced in the generated magnetic field is used to heat an object to be heated made of a metallic material. Regarding basic theories of induction heating, when electric current is supplied to a working coil or a heating coil, heat is generated while an object to be heated is inductively heated, and the object to be heated is heated by the generated heat.

An electric range that operates using the induction heating method is disclosed in KR Patent No. 10-1307594, which is hereby incorporated by reference. A printed circuit board that controls operations of the electric range is mounted onto the electric range. To suppress overheating of the printed circuit board, a heat sink for cooling heat generating elements producing relatively large amounts of heat can be disposed on the printed circuit board.

An air blowing fan is disposed adjacent to the heat sink to cool the heat sink, and an air guide that guides a flow of air discharged from the air blowing fan is provided to cover the heat sink. Additionally, the air guide and the air blowing fan can communicate with each other.

Heat generating elements disposed in an air flow space of the air guide can be effectively cooled by air blown by the air blowing fan.

A plurality of heat generating elements that produces large amounts of heat and needs to be cooled can be disposed at the heat sink surrounded by the air guide. Each of the heat generating elements disposed at the heat sink can be spaced in a direction in which air flows in the heat sink. Accordingly, there is a growing demand for a structure in which air flows evenly within the air guide such that the heat generating elements arranged at the heat sink together with the heat sink all are cooled evenly and efficiently.

BRIEF DESCRIPTION OF THE DRAWINGS

Embodiments will be described in detail with reference to the following drawings in which like reference numerals refer to like elements, and wherein.

DETAILED DESCRIPTION

Figure 1:
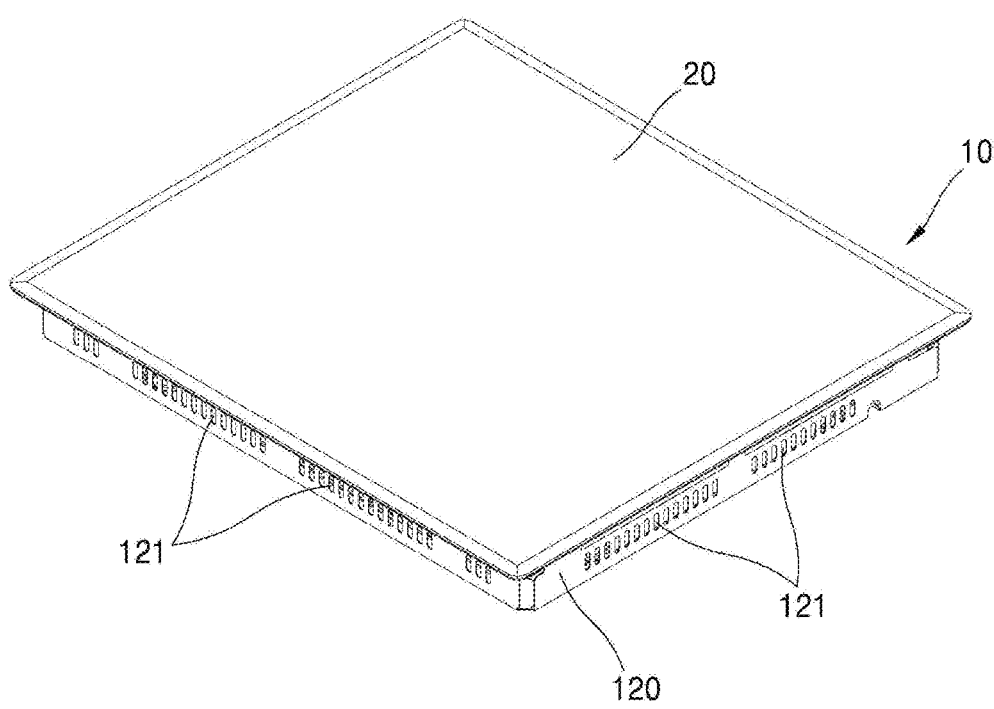
FIG. 1 is a perspective view of an electric range of according to an embodiment.

Aspects, features, and advantages are described hereinafter with reference to the accompanying drawings such that one having ordinary skill in the art to which embodiments pertain can embody the embodiments. In this disclosure, descriptions of known technologies in relation to the embodiments are omitted if they could make understanding unnecessarily vague. Hereinafter, embodiments are described with reference to the accompanying drawings. In the drawings, identical reference numerals can denote identical or similar components.

The terms "first" and "second", for example, are used herein only to distinguish one component from another component. Thus, the components should not be limited by the terms. Certainly, a first component can be a second component unless stated to the contrary.

Throughout, each component can be provided as a single one or a plurality of ones, unless explicitly stated to the contrary.

The singular forms "a", "an" and "the" are intended to include the plural forms as well, unless explicitly indicated otherwise. It should be further understood that the terms "comprise" or "include", for example, set forth herein, are not interpreted as necessarily including all the stated components or steps but can be interpreted as excluding some of the stated components or steps or can be interpreted as including additional components or steps.

Throughout, the terms "A and/or B" as used herein can denote A, B or A and B, and the terms "C to D" can denote C or greater and D or less, unless stated to the contrary.

Throughout, an "up-down direction" denotes an up-down direction of an electric range in a state in which the electric range is installed for use. A "left-right direction" denotes a direction orthogonal to the up-down direction, and a "front-rear direction" denotes a direction orthogonal to the up-down direction and the left-right direction. "Both lateral directions" or a "lateral direction" may have the same meaning as the left-right direction or the front-rear direction. These terms can be mixedly used in the disclosure.

Figure 2:
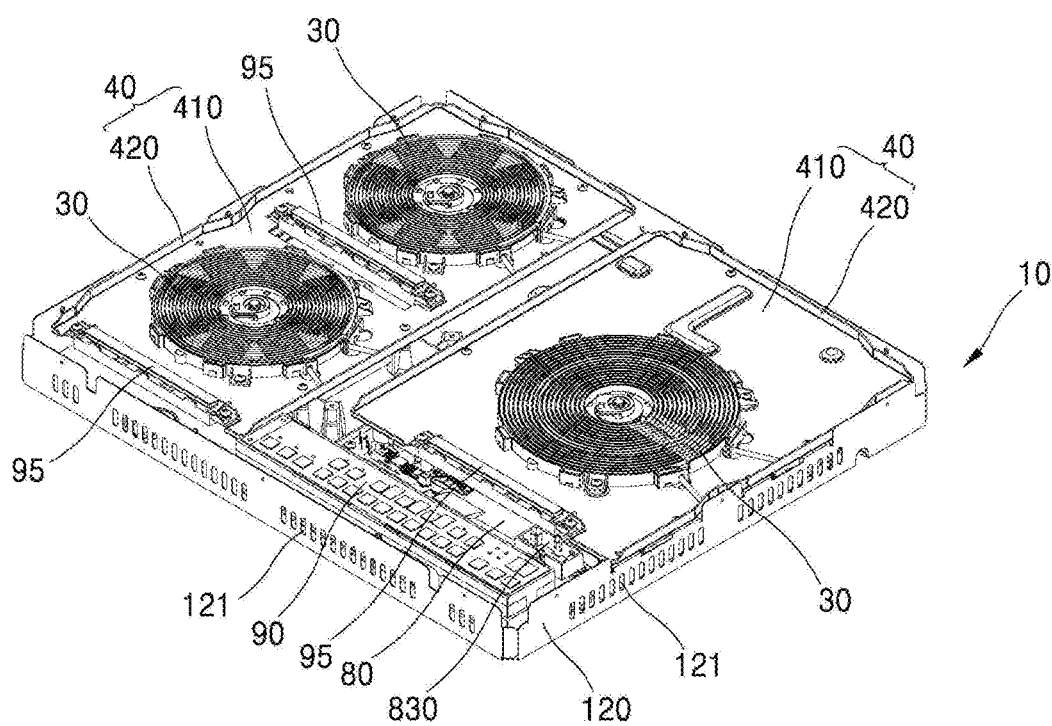
FIG. 2 is a perspective view of the electric range of FIG. 1 without a cover plate.
Figure 3:
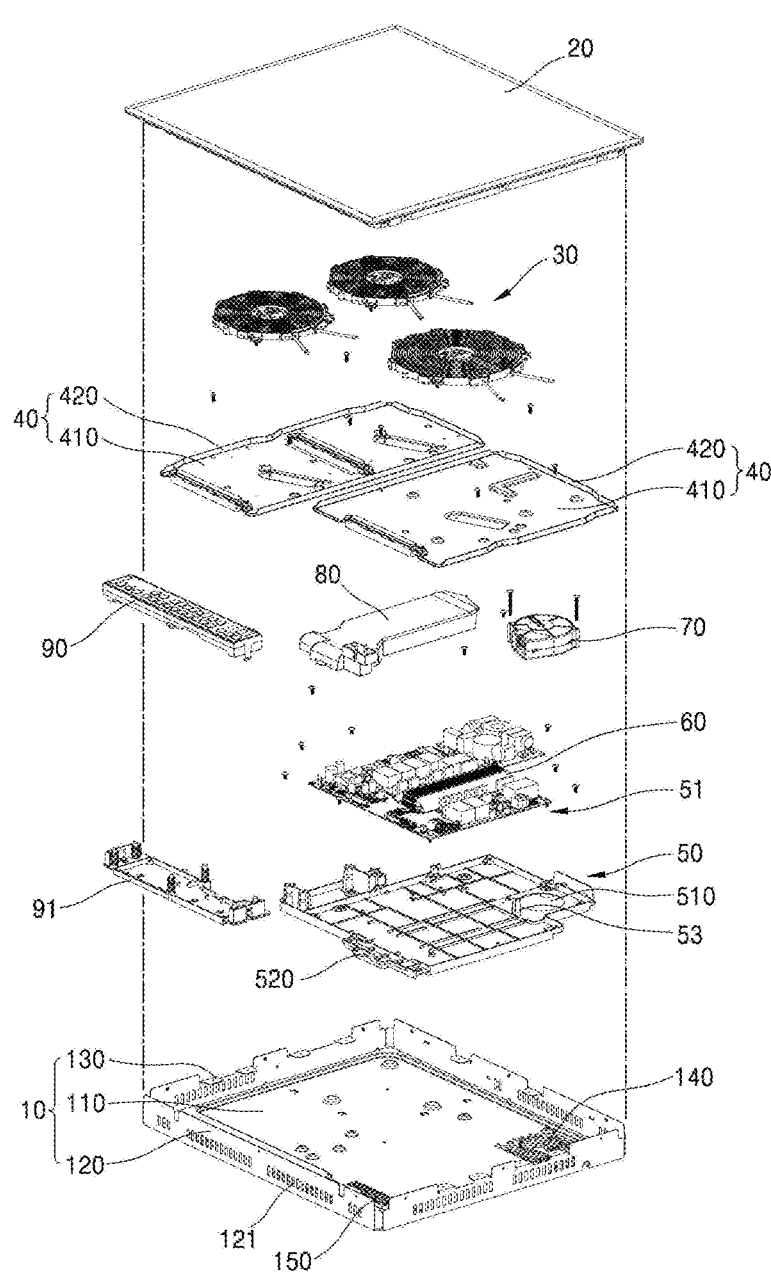
FIG. 3 is an exploded view showing the electric range according to an embodiment.
Figure 4:
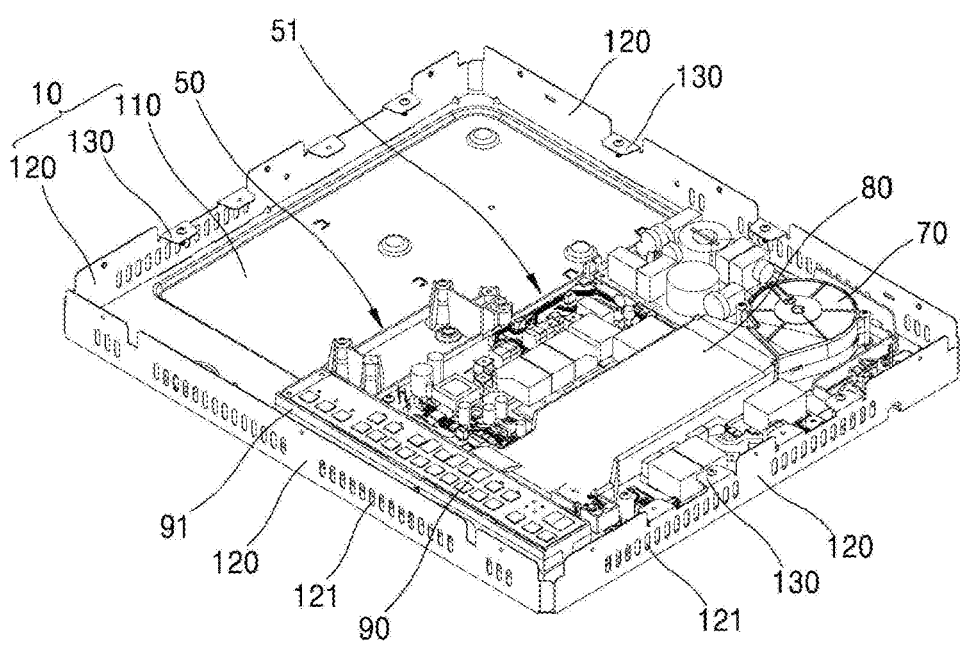
FIG. 4 is a perspective view of the electric range of FIG. 1 without some components.
Figure 5:
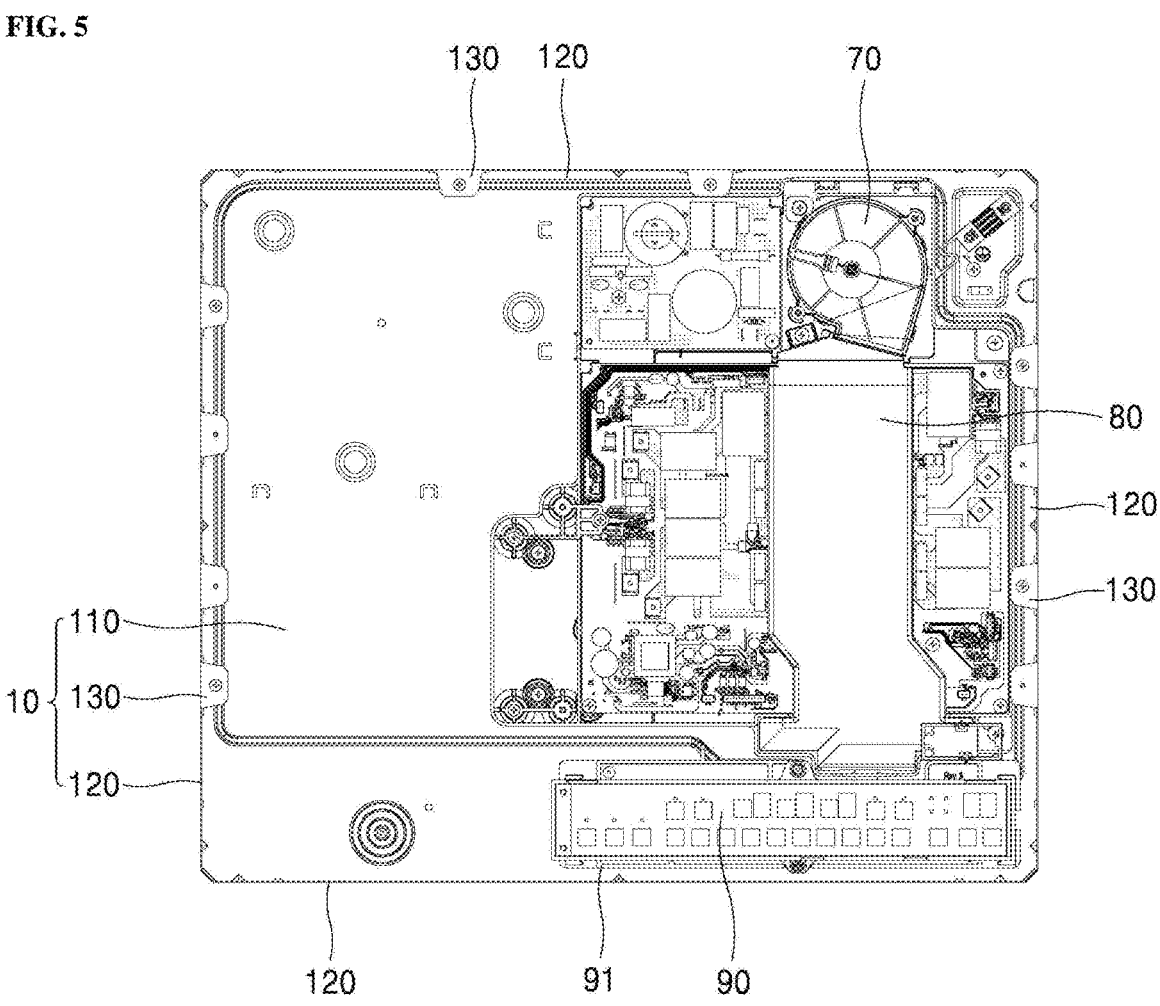
FIG. 5 is a front view of the electric range of FIG. 4.

FIG. 1 is a perspective view of an electric range according to an embodiment. FIG. 2 is a perspective view of the electric range of FIG. 1 without a cover plate 20. FIG. 3 is an exploded view of the electric range according to an embodiment. FIG. 4 is a perspective view of the electric range of FIG. 1 without some components. FIG. 5 is a front view of the electric range of FIG. 4.

The electric range according to an embodiment may inductively heat an object to be heated. In this case, the object to be heated may be, for example, a cooking container containing metal, such as stainless steel, or iron, for example. The induction heating method involves supplying high-frequency power to a working coil to generate a magnetic field around the working coil, and heating an object to be heated made of metal using eddy current produced by the generated magnetic field.

That is, as high-frequency power is supplied to a working coil of a heating part (heater) 30 having a structure in which the working coil is adjacent to a ferrite core, a magnetic field is generated around the working coil, and as a cooking container as an object to be heated is placed in an area of the generated magnetic field, eddy current is induced to the cooking container by the magnetic field, and Joule's heat is generated by the eddy current, thereby heating the cooking container. As the object to be heated is heated, the food contained in the object to be heated is heated and cooked.

The electric range according to an embodiment may include a case 10, a cover plate 20, the heating part 30, an upper bracket 40, and a base bracket 50. The case 10 may protect components constituting the electric range. For example, the case 10 may be made of aluminum; however, embodiments are not limited. Additionally, the case 10 may be thermally insulated to suppress the transfer of heat generated by the working coil of the heating part 30 out of the heating part 30.

The case 10 may accommodate components, such as the heating part 30, a working coil, the upper bracket 40, and a control board 90, for example, that constitute the electric range. An upper portion of the case may be open, and open portion may be closed by the cover plate 20. The case 10 may be overall formed into a box shape and made up by processing plate-shaped materials, for example.

The case 10 may include a first casing 110, a second casing 120, and a third casing 130. The first casing 110 may form a bottom surface of the case 10. The first casing 110 may support the above-described components built into the electric range.

The first casing 110 may be provided with at least one vent through which air flows, to effectively cool a printed circuit board 51 in the first casing 110 and circuit element components mounted on the printed circuit board 51.

The second casing 120 may be bent from the first casing 110, and form a lateral surface of the case 10. The second casing 120 may be vertically bent from an edge of the first casing 110, and become a lateral wall of the electric range.

The second casing 120 may be disposed on each side of the first casing 110, thereby forming a rectangle. The second casing 120 may improve a rigidity of the entire case 10. That is, the second casing 120 bent from the first casing 110 may suppress deformation of the plate-shaped first casing 110 or damage caused by a weight of the built-in components or an external force.

The second casing 120 may have slits, and further include a plurality of exhaust holes 121. The exhaust holes 121 allow an inside and outside of the case 10 to communicate with each other, such that air flows through the exhaust holes 121 and helps cool the components stored in the case 10.

The third casing 130 may be bent from the second casing 120, and support the upper bracket 40. The third casing 130 may be disposed on each side of the first casing 110.

A first upper plate 410 forming a bottom surface of the upper bracket 40 may be mounted on an upper surface of the third casing 130. The first upper plate 410 and the third casing 130 may be coupled to each other by a coupling member, such as a bolt, for example.

The cover plate 20 may be coupled to the upper end of the case 10, and an object to be heated may be placed on an upper surface of the cover plate 20. The cover plate 20 may close the open upper portion of the case 10 to protect the components stored in the case 10.

An object to be heated is placed on the upper surface of the cover plate 20, and a magnetic field generated in the heating part 30 passes through the cover plate 20 and reaches the object to be heated. The cover plate 20, for example, may be made of a material including ceramics; however, embodiments are not limited thereto.

An input interface configured to receive an input from a user may be disposed on the upper surface of the cover plate 20. The input interface may be installed in a specific area of the upper surface of the cover plate 20 and display a specific image.

The input interface may receive a touch input from the user, and the electric range may operate based on the received touch input. For example, as a module for inputting a heating intensity or heating time, for example, desired by the user, the input interface may be embodied as a physical button or a touch panel, for example. For example, the input interface may be a thin-film-transistor liquid-crystal display (TFT LCD); however, embodiments are not limited thereto.

The control board 90 that inputs an operation instruction to the electric range may be disposed under the cover plate 20. The control board 90 may be provided with a plurality of key switches, and the user may input an instruction to the control board 90 through a key switch to control an operation of the electric range.

The electric range may be provided with a board supporter 91 to stably mount the control board 90 onto the case 10. The board supporter 91 may be disposed in the case 10, and the control board 90 may be mounted onto the board supporter 91.

The board supporter 91 may have a shape configured to be reliably mounted onto the case 10 and mount the control board 90 thereon. The board supporter 91 may be made of plastics, for example, to allow injection molding and may be electrically insulated such that the board supporter is easily manufactured, lightweight, and electrically insulated; however, embodiments are not limited thereto.

The upper surface of the control board 90 may closely contact a lower surface of the cover plate 20. In this case, the control board 90 may be disposed in a position corresponding to the input interface.

The control board 90 and the input interface may be connected to each other based on a capacitive touch input. As the user inputs a control instruction to the input interface, the control instruction may be input to the control board 90.

Additionally, a display that displays a drive state of the electric range may be disposed in a specific area of the upper surface of the cover plate 20.

A light display area may be formed on the upper surface of the cover plate 20. A light source unit 95 may be disposed under the cover plate 20, and light irradiated from the light source unit 95 may be delivered to the user through the light display area.

The light display area and the light source unit 95 may be disposed in a mutually corresponding position. When a plurality of light source units 95 is provided, the number of the light display areas disposed on the upper surface of the cover plate 20 may be the same as the number of the light source units.

The electric range may further include a cover bracket that supports the cover plate 20. The cover bracket may support the cover plate 20, on the upper surface of case 10, and be coupled to the second casing 120 of the case 10 by a coupling member, such as a screw bolt, for example.

A plurality of heating parts 30 may be provided, and the plurality of heating parts is disposed under the cover plate 20 and heats the object to be heated. The heating part 30 may be based on induction heating.

According to another embodiment, some of the plurality of heating parts 30 may be based on induction heating, and the rest may be embodied as a highlight heating device based on electric resistance heating. Accordingly, the electric range may be embodied as a hybrid range.

Hereinafter, an electric range in which the plurality of heating parts 300 are all based on induction heating is disclosed.

The heating part 30 may be mounted onto the upper bracket 40, and a total of three heating parts may be provided. However, the number of the heating parts 30 is not limited thereto. When a plurality of heating parts 30 is provided, a plurality of upper brackets 40 that supports the heating parts 30 may be provided when necessary.

The heating part 30 is provided with a core frame. A working coil is spirally wound around an upper surface of the core frame, and a ferrite core may be mounted onto a lower surface of the core frame. Accordingly, as high-frequency power is supplied to the working coil, a magnetic field is formed around the ferrite core, and the formed magnetic field may induce eddy current to an object to be heated.

The upper bracket 40 may be disposed under the heating part 30 and support the heating part 30. A plurality of upper brackets 40 may be provided. The upper bracket 40, for example, may be made of aluminum; however, embodiments are not limited thereto.

The upper bracket 40 may be formed into an approximate box shape by, for example, processing plate-shaped metal, to support the heating part 30. The upper bracket 40 may include a first upper plate 410 and a second upper plate 420. The first upper plate 410 may form a bottom surface of the upper bracket 40, and the heating part 30 may be mounted onto the first upper plate 410.

The first upper plate 410 may vertically cover the printed circuit board 51 disposed thereunder. When a plurality of upper brackets 40 is provided, depending on a surface area of the printed circuit board 51, a single first upper plate 410 or a plurality of first upper plates 410 mutually coupled may cover the printed circuit board 51.

With this structure, the first upper plate 410 may block electromagnetic fields and electromagnetic waves that are generated from the heating part 30, from reaching the printed circuit board 51 and elements mounted onto the printed circuit board 51. That is, the upper bracket 40 may improve electromagnetic compatibility (EMC) and electromagnetic interference (EMI) for the printed circuit board 51.

The second upper plate 420 may be bent from the first upper plate 410 in an upward-downward direction of the electric range. The second upper plate 420 may be bent from an edge of the first upper plate 410 vertically.

The second upper plate 420 may be disposed on each side of the first upper plate 410 that is formed overall into a rectangle. When a plurality of the first upper brackets 410 is provided, the second upper plate 420 may be formed on each side of the first upper plate 410 except for a portion that a plurality of the first upper bracket 410 is adjacent to each other.

The second upper plate 420 may improve a rigidity of the entire upper bracket 40. That is, the second upper plate 420 bent from the first upper plate 410 may suppress deformation of the plate-shaped first upper plate 410 or damage caused by a weight of the built-in components including the heating part 30 or an external force.

The light source unit 95 may be disposed on the upper bracket 40. For example, the light source unit 95 may be disposed on the printed circuit board 51 under the upper bracket 40, and the upper bracket 40 may have an opening that is disposed in a position corresponding to the light source unit 95.

The light source unit 95 may be disposed on the upper bracket 40, and electrically connect to the printed circuit board 51 under the light source unit 95. FIGS. 2 and 3 show the electric range having a structure in which the light source unit 95 is disposed on the upper bracket 40.

As described above, a light display area may be formed in a portion of the cover plate 20, which corresponds to the light source unit 95. The light source unit 95, for example, may be provided in such a way that a plurality of LEDs is arranged in a line.

The light source unit 95 may light up as the heating part 30 operates to inform the user whether the heating part 30 operates. Alternatively, the light source unit 95 may change a shape, or color, for example, of the light of the plurality of LEDs to inform the user about an operation state of the electric range.

A number of the light source units 95 may be determined properly depending on a number of the heating parts 30. FIGS. 2 and 3 show three light source units 95 provided for three heating parts 30. However, the number of the light source units 95 is not limited thereto.

The base bracket 50 may be disposed under the upper bracket 40, and the printed circuit board 51 may be mounted onto the base bracket 50. The base bracket 50 may include a bottom plate and a lateral plate. The bottom plate forms the bottom surface of the base bracket 50, and the printed circuit board 51 may be mounted onto the upper surface of the bottom plate.

The lateral plate may be bent from the bottom plate in the upward-downward direction of the electric range. The lateral plate may be formed in such a way that it is bent from an edge of the bottom plate vertically.

The lateral plate may be disposed on each side of the bottom plate entirely formed into a rectangle. When a plurality of upper brackets 40 is provided, the lateral plate may be formed on each side of the bottom plate except for each side of the upper bracket 40 that is adjacent to another side.

The lateral plate may improve the rigidity of the entire base bracket 50. That is, the lateral plate bent from the bottom plate may suppress deformation of the plate-shaped bottom plate or damage caused by a weight of built-in components of the circuit board, for example, or an external force.

The base bracket 50 may be made of, for example, plastics that ensures ease of injection molding and may be electrically insulated such that the base bracket is easily manufactured, lightweight, and electrically insulated; however, embodiments are not limited thereto.

The printed circuit board 51 may be a controller, receive power from an external power source, and communicate with an external device in a wired or wireless manner. The electric range may be equipped with a wireless communication circuit board (WiFi PCB) for wireless communication with an external device, and the printed circuit board 51 may be electrically connected to the wireless communication circuit board.

The printed circuit board 51 may be electrically connected to the control board 90 to receive an instruction input by the user from the control board 90. The printed circuit board 51 may electrically connect to the light source unit 95 and the working coil to control operations thereof.

A heat sink 60 may be mounted on the printed circuit board 51, various types of active elements and passive elements for operating the electric range may be mounted onto the printed circuit board 51, and the printed circuit board 51 may be provided with an electric circuit. The electric range in the embodiment may further include the heat sink 60, an air blowing fan 70, and an air guide 80. An element that generates heat when the electric range operates may be mounted onto the printed circuit board 51.

For example, switching elements in charge of controlling turning-on/off of the heating part 30 generate large amounts of heat, in an electric range. The elements must be cooled to suppress operational error or failure of the electric range, caused by overheating.

The electric range may be provided with the heat sink 60, the air blowing fan 70, and the air guide 80 to cool elements of the printed circuit board 51. Hereinafter, elements that generate large amounts of heat and must be cooled are referred to as "heat generating elements 61".

The heat sink 60 may protect components stored in the case 10 by cooling down the inside of the case 10. The heat sink 60 may be mounted onto the printed circuit board 51 and cool down the printed circuit board 51. Additionally, the heat sink 60 may reduce a temperature of heat generated by electromagnetic interaction as the heating part 30 operates.

For example, the heat sink 60 may include a plurality of cooling fins 610, and the air guide 80 may be provided to cover the plurality of cooling fins 610, thereby guiding air to the plurality of cooling fins 610. The heat sink 60 and the plurality of cooling fins 610 are specifically described with reference to the following drawings.

The air blowing fan 70 may be mounted onto the base bracket 50 and discharge air toward the heat sink 60. The air blowing fan 70 may be electrically connected to the printed circuit board 51, and an operation thereof may be controlled by the controller embodied as the printed circuit board 51.

Referring to FIG. 5, for air, blown by the air blowing fan 70, to flow to the heat sink 60, a guide wall may be formed at an outlet of the air blowing fan 70, through which air is discharged. The guide wall may guide air in a direction in which the heat sink 60 is disposed. As the air blowing fan 70 operates, air in the case 10 is blown to the heat sink 60, and the heat sink 60 may cool the printed circuit board 51 and the inside of the case 10.

Figure 6:
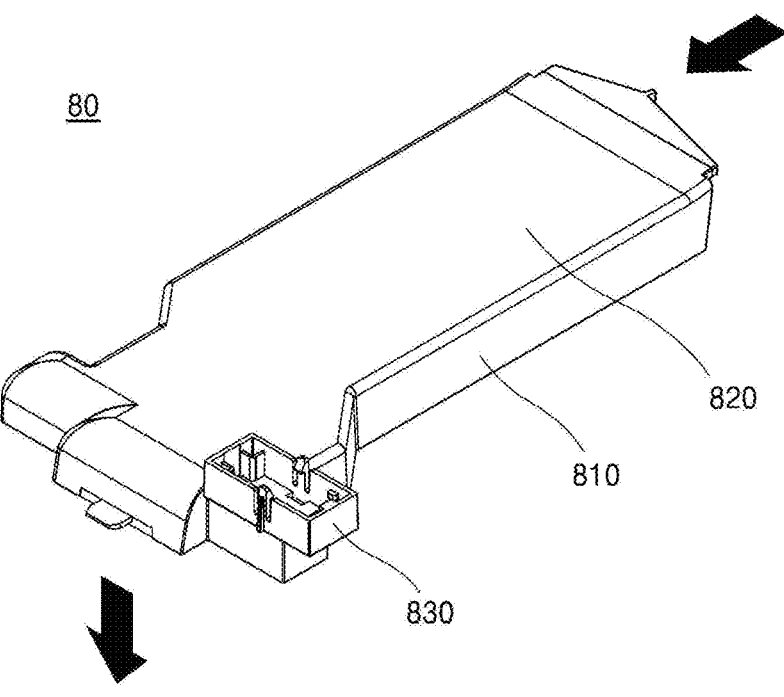
FIG. 6 is a perspective view showing an air guide according to an embodiment.
Figure 7:
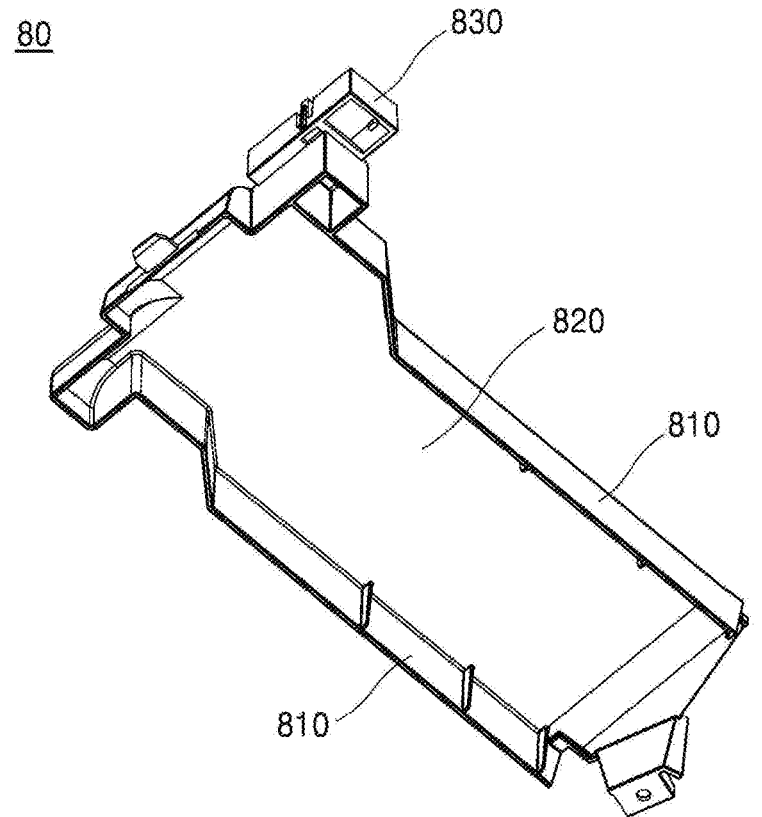
FIG. 7 is a perspective view of the air guide of FIG. 6 viewed from a different direction.
Figure 8:
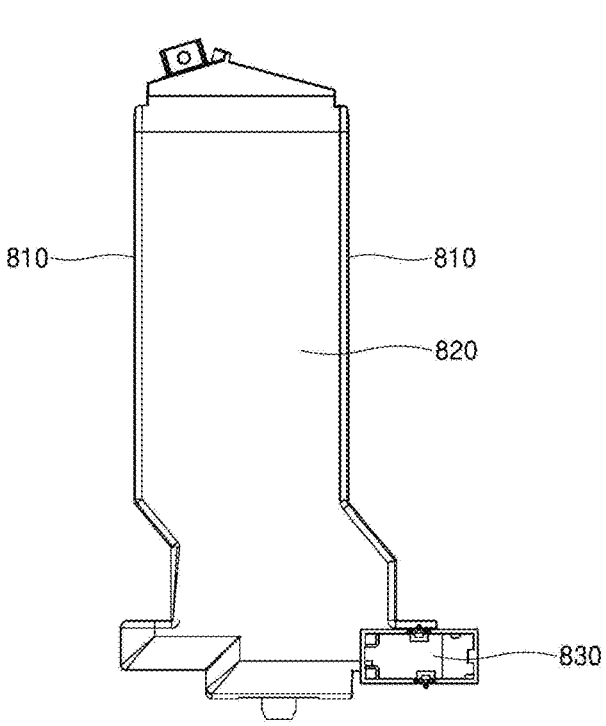
FIG. 8 is a plan view of the air guide according to an embodiment.
Figure 9:
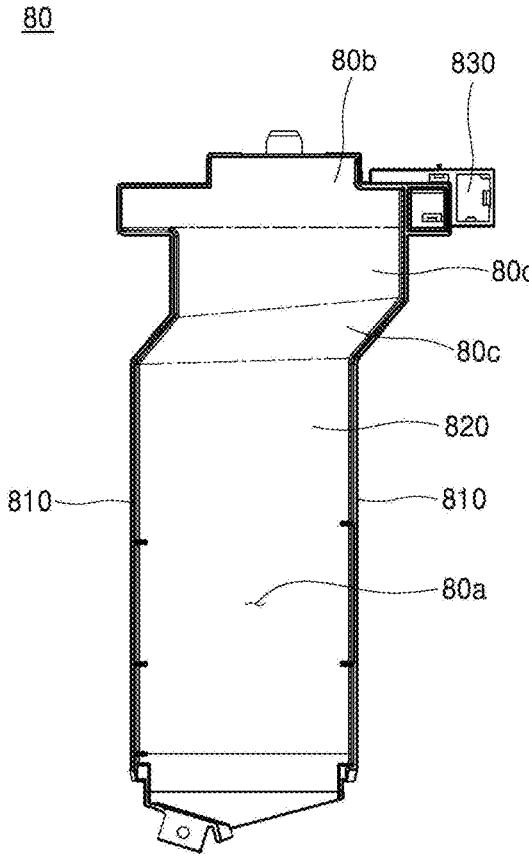
FIG. 9 is a bottom view showing the air guide according to an embodiment.

FIG. 6 is a perspective view of an air guide 80 according to an embodiment. FIG. 7 is a perspective view of the air guide FIG. 6 viewed from a different direction. FIG. 8 is a plan view of the air guide according to an embodiment. FIG. 9 is a bottom view of the air guide according to an embodiment.

The air guide 80 may communicate with the air blowing fan 70, surround the heat sink 60, and form a flow path of air that cools the heat sink 60. The air guide 80, for example, may be made of plastics that ensures easy of injection molding and electrical insulation; however, embodiments are not limited thereto.

The arrows in FIG. 6 indicate directions in which air flows. Referring to FIG. 6, the air guide 80 may change the direction in which air flows. That is, the air guide 80 is formed so that air may flow in the frontward-rearward direction of the electric range at an inlet of the air guide 80 while air may flow in the upward-downward direction of the electric range at an outlet of the air guide 80.

With this structure, air discharged from the air blowing fan 70 may flow into the air guide 80 in the frontward-rearward direction of the electric range, and escape out of the air guide 80 in a downward direction of the electric range. Further, the air guide 80 may be detachably coupled to the base bracket 50. For example, a rear of the air guide 80 adjacent to the air blowing fan 70, may be coupled to the base bracket 50 by a coupling tool, such as a screw bolt, for example. Additionally, for example, a front of the air guide 80, through which air is discharged, may be shape-fitted to the base bracket 50.

The air guide 80 may include a first lateral wall 810 and a second lateral wall. A flow space in which air flows may be formed by the first lateral wall 810 and the second lateral wall.

A pair of first lateral walls 810 may be provided, and the pair of first lateral wall 810 may be respectively disposed on both sides of the heat sink 60. An upper wall 820 may be coupled to an upper end of the pair of first lateral walls 810 to cover the heat sink 60.

The space formed by the first lateral wall 810 and the second lateral wall may be a flow space in which air flows. The heat sink 60 may be disposed in the flow space, and the heat sink 60 may be cooled by air flowing in the flow space of the air guide 80.

The air guide 80 may be provided with a communication substrate mounting part (mount) 830. The communication substrate mounting part 830 may be disposed in a portion that protrudes from an end portion of the upper bracket 40 laterally, in a state in which the air guide 80 is mounted onto the electric range.

With this structure, a wireless communication circuit board mounted onto a Wi-Fi mounting part or mount is disposed not to vertically overlap the upper bracket 40 made of metal. Accordingly, the wireless communication circuit board may smoothly communicate with an external device, without being interfered with by jamming of the upper bracket 40 made of metal.

Referring to FIG. 9, the air guide 80 may include a first area 80a and a second area 80b. The air guide 80 may further include a third area 80c and a fourth area 80d. The first area 80a to the fourth area 80d may be spaces into which the flow space of air, formed in the air guide 80, may be divided.

The first area 80a may communicate with the air blowing fan 70, and guide air such that the air flows in the lateral direction of the base bracket 50. In this case, the heat sink 60 may be disposed in the first area 80a. Air having flown from the air blowing fan 70 to the air guide 80 may flow to the heat sink 60 and cool the heat sink 60 while passing through the first area 80a of the air guide 80.

The second area 80b may communicate with the first area 80a, be bent in the upward-downward direction of the base bracket 50, and guide air such that the air is discharged outward, for example, in a vertical direction. The second area 80b may face the lower side of the electric range and change a flow direction of air having flown to the air guide 80. That is, the upper wall 820 of the air guide 80 may be bent downward from the second area 80b, and guides air discharged from the second area 80b such that the air flows to the lower portion of the case 10. In the above-described structure, air discharged from the air blowing fan 70 flows into the air guide 80 in the frontward-rearward direction of the electric range, and escapes from the air guide 80 in the downward direction of the electric range, as indicated by the arrows in FIG. 6.

The third area 80c and the fourth area 80d may be formed between the first area 80a and the second area 80b. The third area 80c may extend from the first area 80a, and change a flow direction of air having passed through the first area 80a. The first lateral wall 810 of the air guide 80 may be bent from the end portion of the first area 80a to have a slant, and form the third area 80c. That is, the first lateral wall 810 may be formed to have a slant in the frontward-rearward direction of the air guide 80 at the inlet of the third area 80c of the air guide 80. With this structure, air may flow at a slant in the frontward-rearward direction of the air guide 80, in the third area 80c.

As the third area 80c is formed as described above, when the air guide 80 is mounted onto the base bracket 50, elements disposed on the printed circuit board 51 and the first lateral wall 810 do not meet each other in a portion where the base bracket 50 overlaps the air guide 80 vertically. That is, the third area 80c may have a slanted structure to avoid the elements disposed on the printed circuit board 51. In other words, the third area 80c may not be necessary in a case in which the printed circuit board 51 has a low height such that interference between the air guide 80 and the printed circuit board 51 would not occur.

The fourth area 80d may extend from the third area 80c, communicate with the second area 80b, and change a flow direction of air having passed through the third area 80c. The first lateral wall 810 of the air guide 80 may be bent from an end portion of the third area 80c to have a slant, and form the fourth area 80d. In a case in which the third area 80c is not used, the fourth area 80d may extend from the first area 80a, not from the third area 80c.

The first lateral wall 810 may have a slant with respect to the first lateral wall 810 of the third area 80c at the outlet of the third area 80c of the air guide 80. With this structure, a flow direction of air of the air guide 80 may change again to the frontward-rearward direction of the air guide 80, in the fourth area 80d. Air having passed through the fourth area 80d may be discharged from the lower portion of the electric range through the second area 80b. Referring to FIG. 9, air having flown to the outlet of the fourth area 80d in the air guide 80 in the frontward-rearward direction of the electric range changes its flow direction in the second area 80b, and flows to the lower portion of the electric range through the outlet of the second area 80b and is discharged from the air guide 80.

The upper wall 820 of the air guide 80 may be bent downward in the second area 80b, and guide air discharged from the second area 80b such that the air flows to the lower portion of the case 10. That is, air may be discharged from the air guide 80 through the second area 80b marked in FIG. 9, and flow in the downward direction of the electric range, that is, flow to the lower portion of the case 10.

Figure 10:
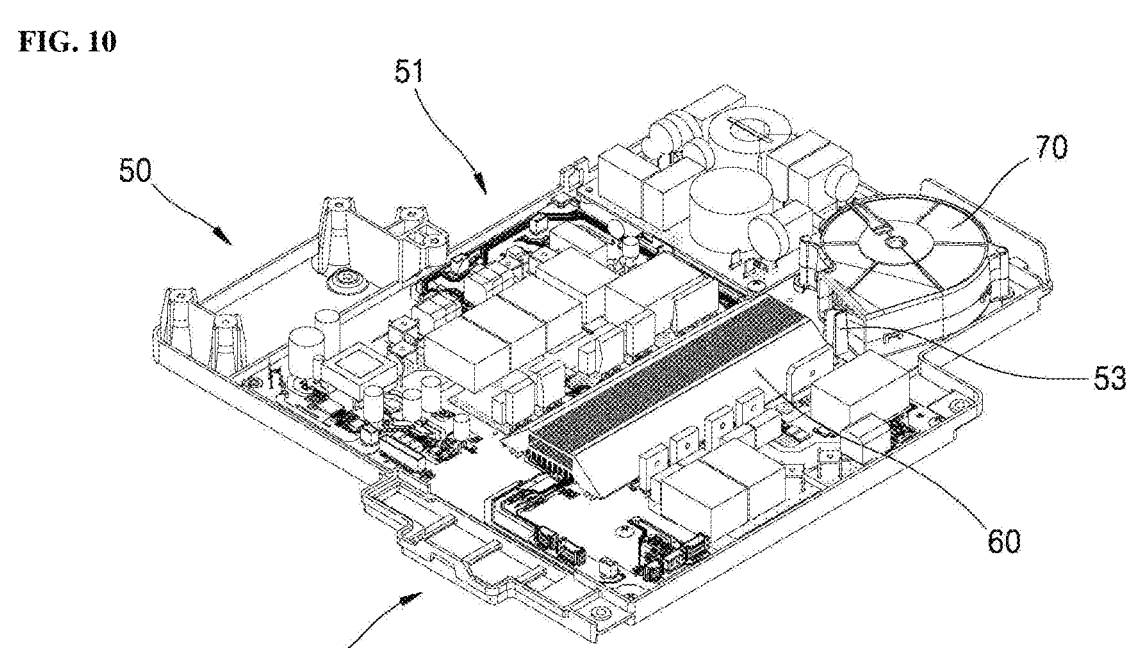
FIG. 10 is a perspective view showing a printed circuit board (PCB) mounted onto a base bracket according to an embodiment.
Figure 11:
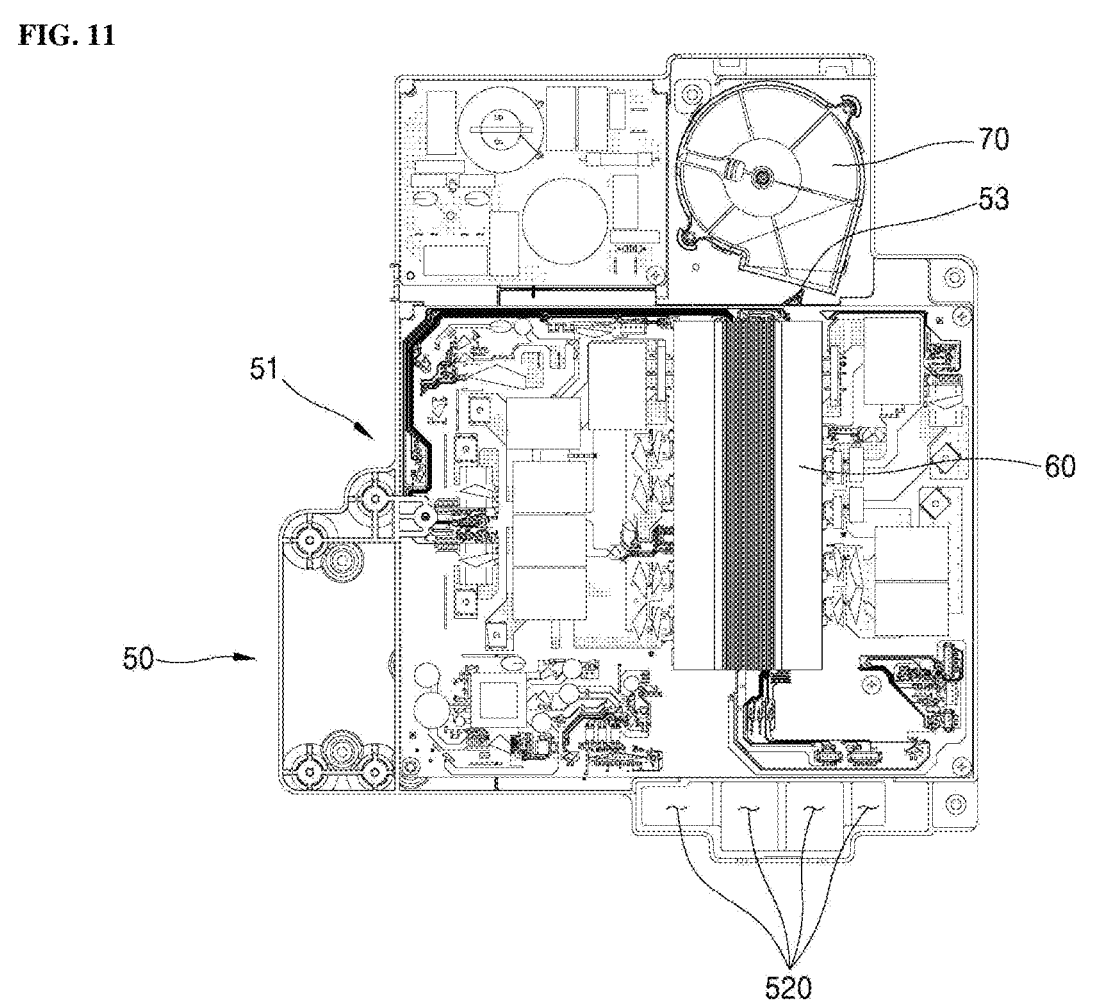
FIG. 11 is a plan view of the PCB mounted on the base bracket of FIG. 10.
Figure 12:
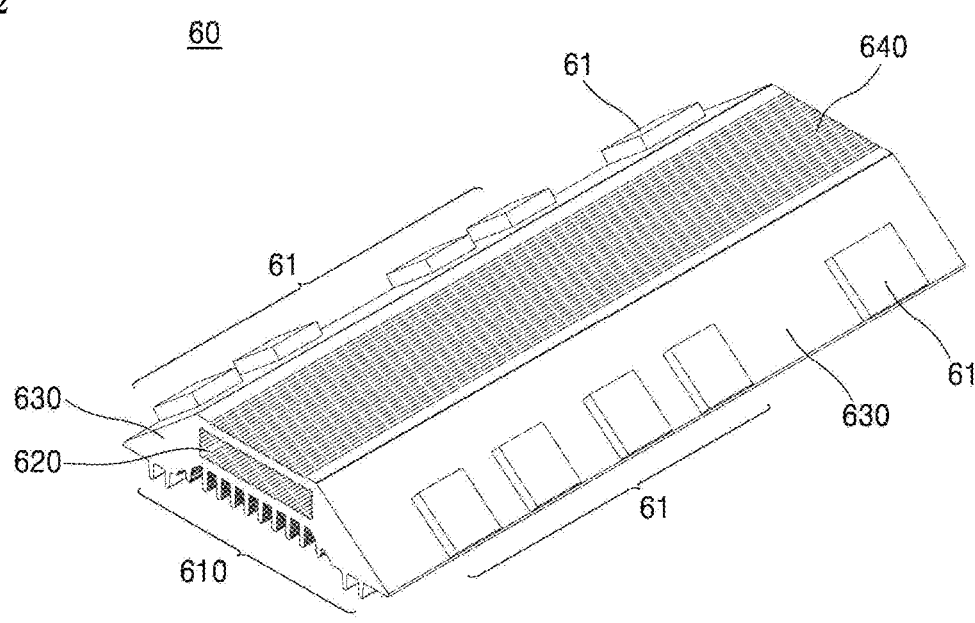
FIG. 12 is a perspective view of a heat sink according to an embodiment.
Figure 13:
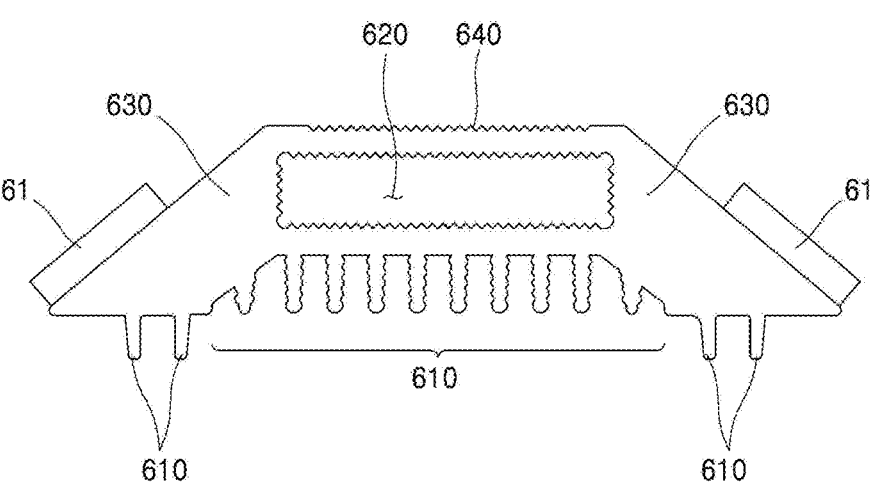
FIG. 13 is a front view of the heat sink according to an embodiment.

FIG. 10 is a perspective view of a printed circuit board (PCB) mounted onto a base bracket according to an embodiment. FIG. 11 is a plan view of the PCB mounted on the base bracket FIG. 10. FIG. 12 is a perspective view of a heat sink according to an embodiment. FIG. 13 is a front view of the heat sink according to an embodiment.

A lengthwise direction of the heat sink 60 may extend parallel with a flow direction of air passing through the air guide 80. With this structure, a contact surface area and time for contact between the heat sink 60 and air flow increases, thereby enhance cooling efficiency of the heat sink 60.

To correspond to the above-described arrangement of the heat sink 60, the lengthwise direction of the air guide 80 may also extend approximately in parallel with a flow direction of air.

As illustrated in FIGS. 12 and 13, the heat sink 60 may be provided with a plurality of cooling fins 610. The plurality of cooling fins 610 may protrude downward from a lower surface of the heat sink 60, and extend in a direction parallel with the lengthwise direction of the heat sink 60. The plurality of cooling fins 610 helps to increase a contact surface area between the heat sink 60 and air in the heat sink 60, thereby enhancing cooling efficiency of the heat sink 60.

Each of the plurality of cooling fins 610 may be spaced at proper or predetermined intervals on the lower surface of the heat sink 60 in a widthwise direction of the heat sink 60. In this case, the cooling fin 610 may be respectively formed in a slanted part or portion 630 and a plane part or portion 640 of the heat sink 60.

Additionally, the heat sink 60 may be provided with a flow channel 620 that passes through the heat sink 60 in the lengthwise direction thereof and forms a flow path of air. The flow channel 620 may extend in the lengthwise direction of the heat sink 60, and pass through the plane part 640 of the heat sink 60.

As mentioned with reference to the plurality of cooling fins 610, the flow channel 620 helps to increase a contact surface area between the heat sink 60 and air in the heat sink 60, thereby enhancing cooling efficiency of the heat sink 60. In this case, the flow channel 620 may have concave and convex portions on an inner surface thereof. The concave and convex portions help to increase a contact surface area between air and the heat sink 60, thereby enhancing cooling efficiency of the heat sink 60.

The heat sink 60 may include the slanted part 630 and the plane part 640. The slanted part 630 may be disposed on both sides of the heat sink 60 and have an upper surface that inclines. The plane part 640 may be formed at a center of the heat sink 60, have the flow channel 620, and have an upper surface which is flat.

Concave and convex portions may be formed on an upper surface of the plane part 640. The concave and convex portions may help to increase a contact surface area between air and the heat sink 60, thereby enhancing cooling efficiency of the heat sink 60.

All or some of the heat generating elements 61 included in the printed circuit board 51 may be mounted onto the upper surface of the slanted part 630. Accordingly, air blown by the air blowing fan 70 may cool the heat generating elements 61 mounted onto the slanted part 630 of the heat sink 60, and effectively suppress overheating of the printed circuit board 51.

The slanted part 630 may have a structure in which a thickness of the slanted part decreases toward an edge thereof. The structure of the slanted part 630 plays a similar role to the cooling fin 610, to effectively cool the heat generating elements 61 mounted onto the slanted part 630.

Figure 14:
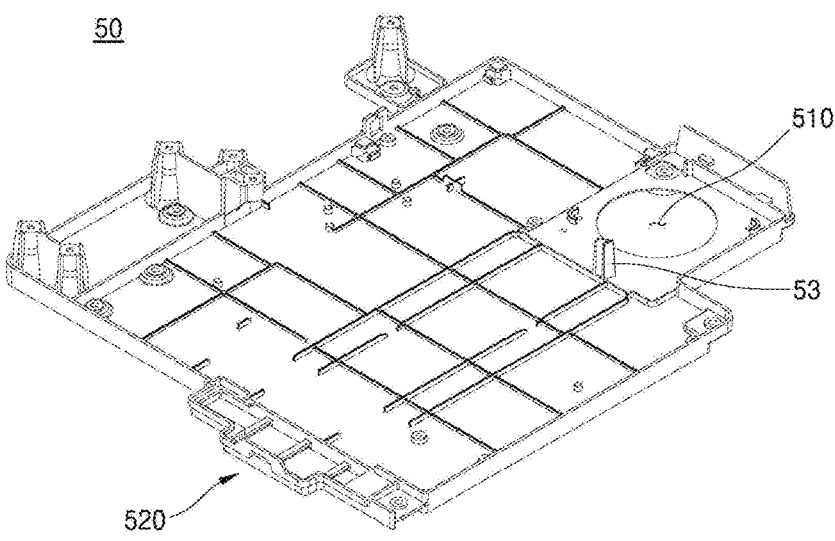
FIG. 14 is a perspective view of the base bracket according to an embodiment.
Figure 15:
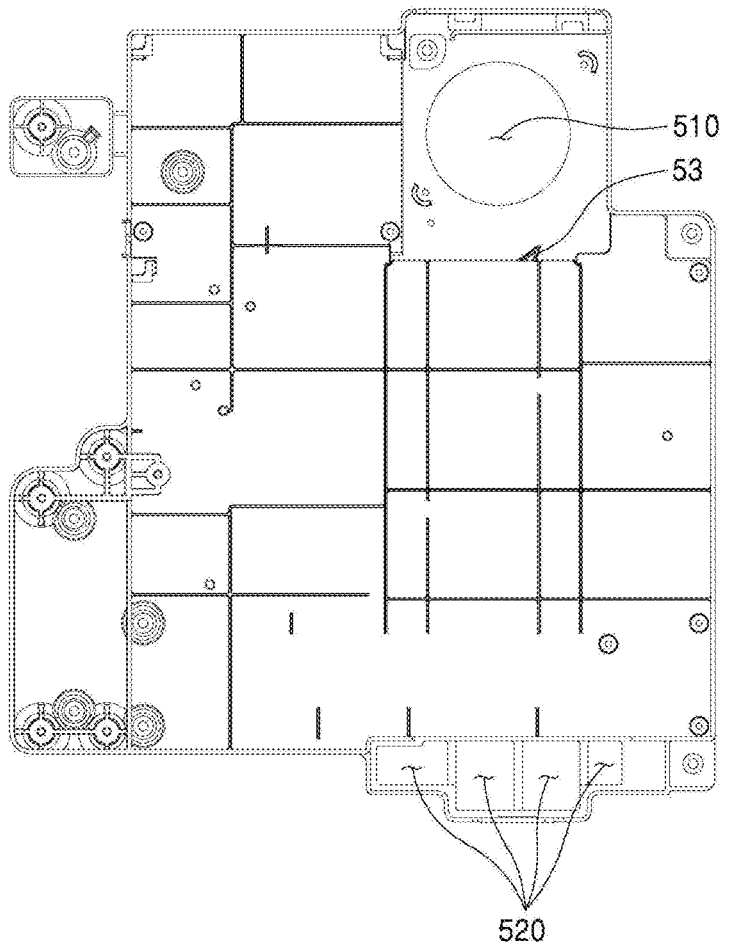
FIG. 15 is a plan view of the base bracket according to an embodiment.

FIG. 14 is a perspective view of the base bracket according to an embodiment. FIG. 15 is a plan view of the base bracket according to an embodiment.

The base bracket 50 may include a first vent part (vent) 510 that is formed at a position corresponding to the air blowing fan 70, and a second vent part (vent) 520 that is formed at a position corresponding to the fourth area 80*d*. In this case, the first vent part 510 may have a shape corresponding to a shape of the air blowing fan 70, and the second vent part 520 may have a shape corresponding to a shape of the fourth area 80*d*.

As the air blowing fan 70 operates, air moves upward from the first vent part 510 and flows into the air blowing fan 70, and as the flow direction of the air changes in the air blowing fan 70, flows in the frontward-rearward direction of the electric range, and passes through the air guide 80 and the heat sink 60. The flow direction of the air changes again at the outlet of the air guide 80, and the air flows to the lower side of the electric range, passes through the second vent part 520, and is discharged out of the air guide 80.

A pair of slanted parts or portions 630 may be provided for the heat sink 60, and the slanted part may be respectively disposed symmetrical to a center of the plane part 640. A heat generating element 61 that needs to be cooled may be disposed on each slanted part 630.

With this structure, heat generating elements 61 may be disposed in symmetrical positions on both sides of the heat sink 60. To evenly cool the heat generating element 61 disposed on both sides of the heat sink 60, air discharged from the outlet of the air blowing fan 70 needs to be guided such that the air flows to both sides of the heat sink 60 evenly.

In order for air to flow evenly to both sides of the heat sink 60, the electric range may be provided with a vane (vent) 53. The vane 53 may be disposed at a position where the air blowing fan 70 and the air guide 80 communicate with each other, and control flow of air in the air guide 80, to allow the air to flow evenly to both sides of the heat sink 60.

For example, the vane 53 may be formed at the base bracket 50. As another example, the vane 53 may be integrated with the air guide 80, at the inlet of the air guide

80. As yet another example, the vane 53 may be integrated with a housing of the air blowing fan 70, at the outlet of the air blowing fan 70.

Figure 16:
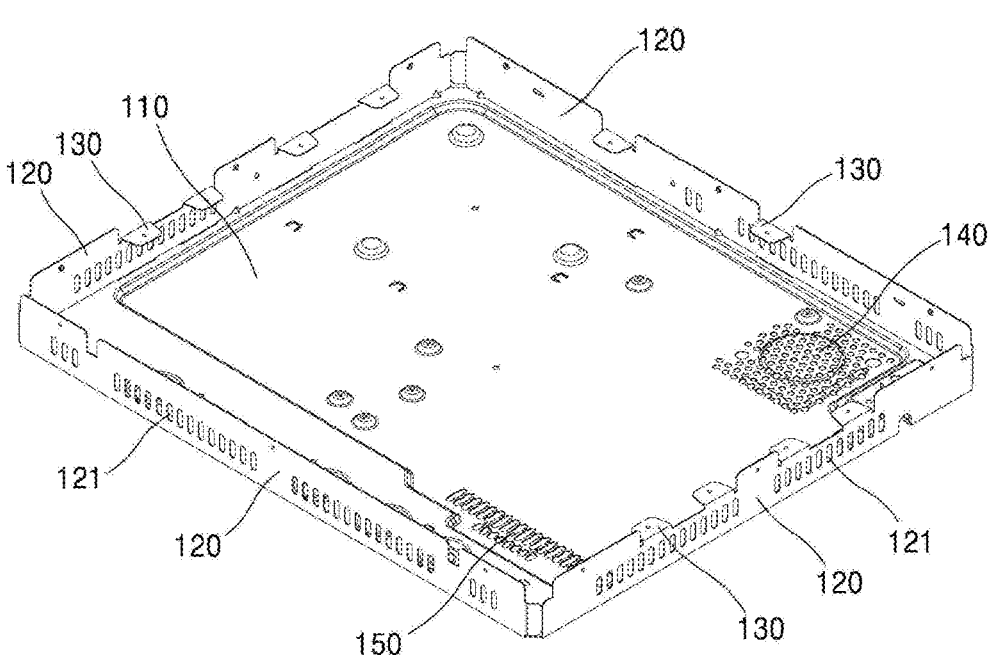
FIG. 16 is a perspective view of a case according to an embodiment.
Figure 17:
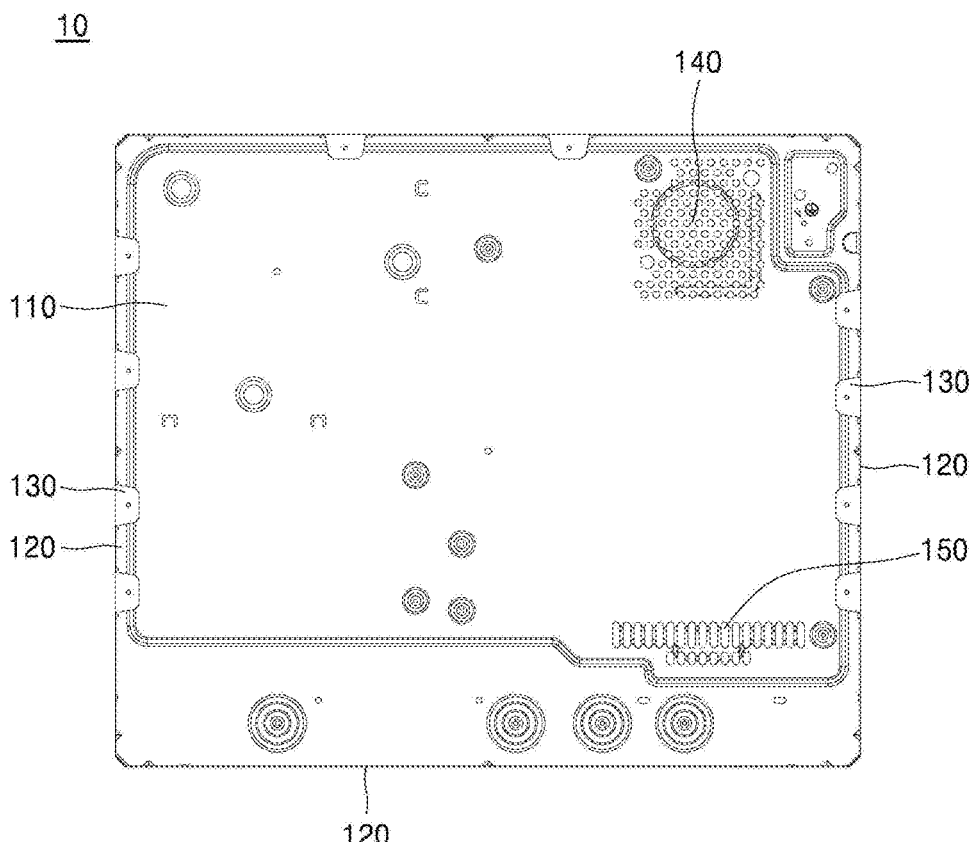
FIG. 17 is a plan view of the case according to an embodiment.

FIG. 16 is a perspective view showing a case according to an embodiment. FIG. 17 is a plan view of the case according to an embodiment. The case 10 may be provided with a first penetration hole 140 and a second penetration hole 150 to effectively introduce and discharge air blown by the air blowing fan 70.

The first penetration hole 140 may be formed at a portion of the case 10 corresponding to the first vent part 510, and the second penetration hole 150 may be formed at a portion of the case 10 corresponding to the second vent part 520. The first penetration hole 140 and the second penetration hole 150 may be formed in such a way that the first casing 110 forming the bottom surface of the case 10 is penetrated.

A plurality of the first penetration holes 140 and a plurality of the second penetration hole 150 may be provided. As the case 10 may be the outermost wall of the electric range, the plurality of first penetration holes 140 and the plurality of second penetration holes 150 may be formed as hole having a relatively small surface area to suppress flow of foreign substances into the electric range through the plurality of first penetration holes 140 and the plurality of second penetration holes 150 formed at the case 10.

A plurality of heat generating elements 61 may be disposed at the heat sink 60 surrounded by the air guide 80, and the heat generating elements 60 need to be cooled as they produce large amounts of heat. Each of the heat generating elements 61 attached to the heat sink 60 may be spaced from each other in a direction in which air flows in the heat sink 60.

In this case, the electric range needs to have a structure in which air flowing in the air guide 80 flows to the flow space of the air guide 80 evenly such that the heat generating elements 61 attached to the heat sink 60 are cooled evenly and efficiently.

The electric range has the structure where air evenly flows to the heat sink 60. In particular, when the heat generating elements 61 are disposed symmetrically on both sides of the heat sink 60 with respect to the center of the heat sink 60, the electric range needs to have a structure in which air flows to both sides of the heat sink evenly.

Figure 18:
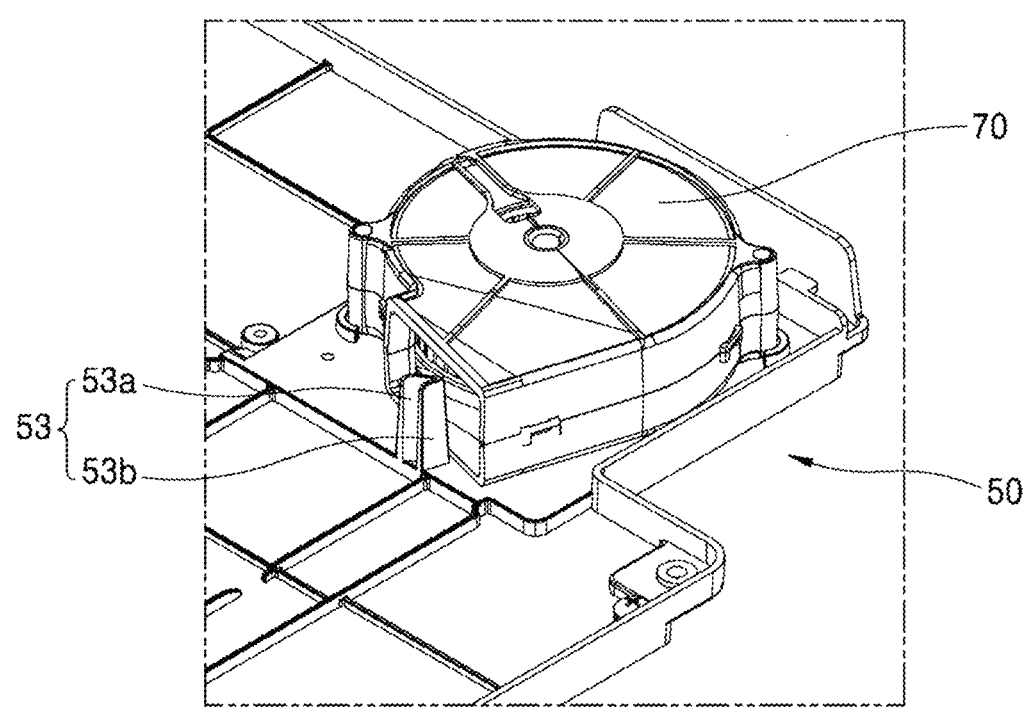
FIG. 18 is a partial enlarged view of a base bracket with a vane according to an embodiment.
Figure 19:
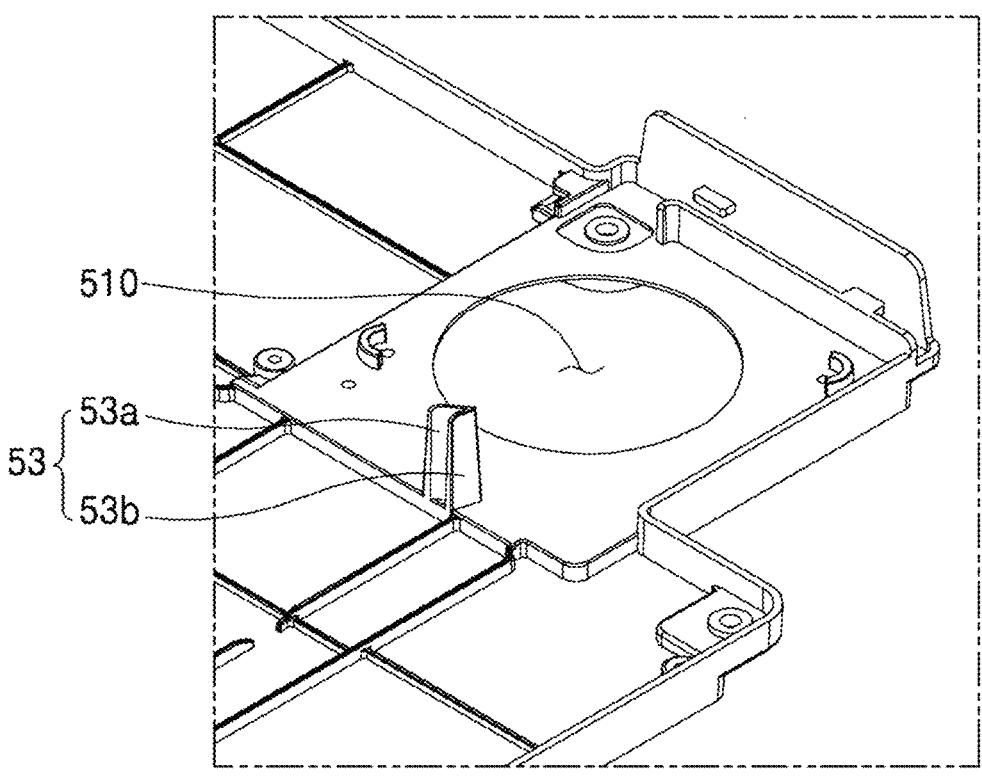
FIG. 19 is a view of the base bracket with the vane of FIG. 18 without an air blowing fan.
Figure 20:
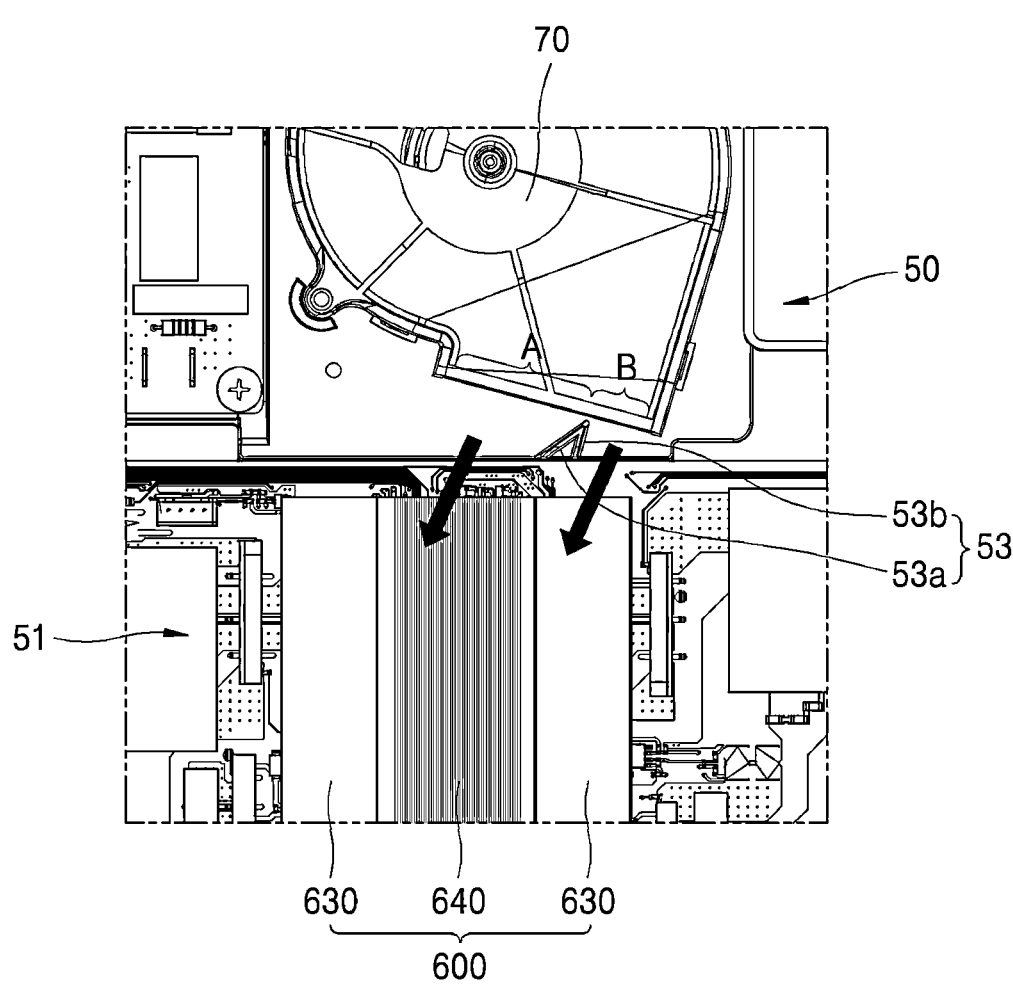
FIG. 20 is a partial enlarged view showing a portion where the vane and the heat sink according to an embodiment are disposed.

FIG. 18 is a partial enlarged view showing a base bracket 50 with a vane according to an embodiment. FIG. 19 is a view of the base bracket with the vent part of FIG. 18 without an air blowing fan. FIG. 20 is a partial enlarged view showing a portion where the vane and the heat sink according to an embodiment are disposed. The arrows in FIG. 20 indicate directions in which air, discharged from the air blowing fan and blown by the vane, flows.

The electric range may be provided with vane (vent) 53. The vane 53 may be disposed at a position where the air blowing fan 70 and the air guide 80 communicate with each other, and guide flow of air discharged from the air blowing fan 70.

The flow of the air discharged from the air blowing fan 70 may be divided in two by the vane 53 disposed near the inlet of the air guide 80, and a flow direction of the air may be guided such that the air flows into the flow space in the air guide 8.

The vane 53 may include a first vane 53*a* and a second vane 53*b* to divide the flow of air. The first vane 53*a* and the second vane 53*b* may protrude toward the heat sink 60, and the first vane 53*a* may be spaced further from the second vane 53*b* toward the heat sink 60.

That is, the first vane 53a may protrude toward the heat sink 60, and the second vane 53b may be separated from the first vane 53a and protrude toward the heat sink 60. Additionally, a distance between the first vane 53a and the second vane 53b may increase in a direction toward the heat sink 53b.

With this structure, the air flow may be divided in two flow paths by the first vane 53a and the second vane 53b while passing through the vane 53, and respectively flow to the slanted part 630 disposed on both sides of the heat sink 60. The two arrows in FIG. 20 indicate a flow direction of each of the two divided flow paths. Though not illustrated in FIG. 20, the heat generating elements 61 may be mounted approximately symmetrically with respect to the plane part 640 on the upper surface of each of the slanted part 620 disposed on both sides of the heat sink 60, as illustrated in FIG. 12.

In this embodiment, air discharged from the air blowing fan 70 is divided into two flow paths by the first vane 53a and the second vane 53b, and air in each of the flow paths flows to the slanted part 630 disposed on both sides of the heat sink 60 and evenly cools each of the slanted parts 630. With this structure, the heat generating elements 61 disposed on each slanted part 630 may be cooled evenly and efficiently. If the electric range is without the vane 53, air discharged from the air blowing fan 70 may not be distributed evenly to both of the slanted parts 630.

Referring to FIG. 20, a rotating fan in the air blowing fan 70 rotates in the upward-downward direction of the electric range, about a rotational axis. In this case, at the outlet of the air blowing fan 70, the right side of FIG. 20, that is, area B adjacent to an outer area of the air blowing fan 70, has a higher air flow velocity and a higher air flow rate than other areas because of centrifugal force. On the contrary, the left side of FIG. 20, that is, area A closer to a center of the air blowing fan 70 than area B, has a lower air flow velocity and a lower air flow rate than area B. Accordingly, air discharged from the air blowing fan 70 has a high flow velocity and a high flow rate in area B such that the slanted part 630 adjacent to area B may cool more than the slanted part 630 adjacent to area A, making it hard to evenly cool both of the slanted parts 630.

In this embodiment, the vane 53 divides the air flow into two flow paths such that the air flows evenly to the slanted parts 630 symmetrically disposed on/at the heat sink 60. Additionally, cross sections of area A and area B need to be relatively adjusted at the outlet of the air blowing fan 70 such that air flows to both of the slanted parts 630 of the heat sink 60 at a uniform flow velocity and flow rate.

The vane 53 may be provided to divide the cross section of the outlet of the air blowing fan 70. Further, the vane 53 may be disposed in a portion where a portion having a relatively higher air flow rate has a relatively small area, while a portion having a relatively lower flow rate has a relatively large area, in the cross section of the outlet of the air blowing fan 70.

Referring to FIG. 20, the rotating fan in the air blowing fan 70 rotates around a rotational axis extending in the upward-downward direction of the electric range, as described above. The outlet of the air blowing fan 70 may be divided into area A and area B that are mentioned above with respect to a sharp edge of the vane 53 facing the air blowing fan 70.

In this case, at the outlet of the air blowing fan 70, area A has a lower air flow velocity and a lower air flow rate than area B because of the centrifugal force. In this case, a position of the vane 53 may be determined, considering area A has a relatively large surface area and area B has a relatively small surface area so that a flow rate of air in each flow path, having passed through area A and area B and having flown into the air guide 80, may be approximately similar.

In this embodiment, as the vane 53 divides the cross section of the outlet of the air blowing fan 70 into areas having a different surface area, each of the flow paths divided by the vane 53 may have a similar flow rate, enabling air to uniformly flow to the pair of slanted parts 630 disposed on both sides of the heat sink 60. Thus, cooling efficiency of the heat sink 60 and the heat generating elements disposed at the heat sink 60 may be improved.

As illustrated in FIG. 19, the vane 53 according to an embodiment may protrude upward from the base bracket 50. That is, the vane 53 may be coupled to the base bracket 50.

The vane 53 may be made of the same material as the base bracket 50 and integrated with the base bracket 50. Alternatively, the vane 53 may be individually manufactured and then mounted onto the bottom surface of the base bracket 50.

Figure 21:
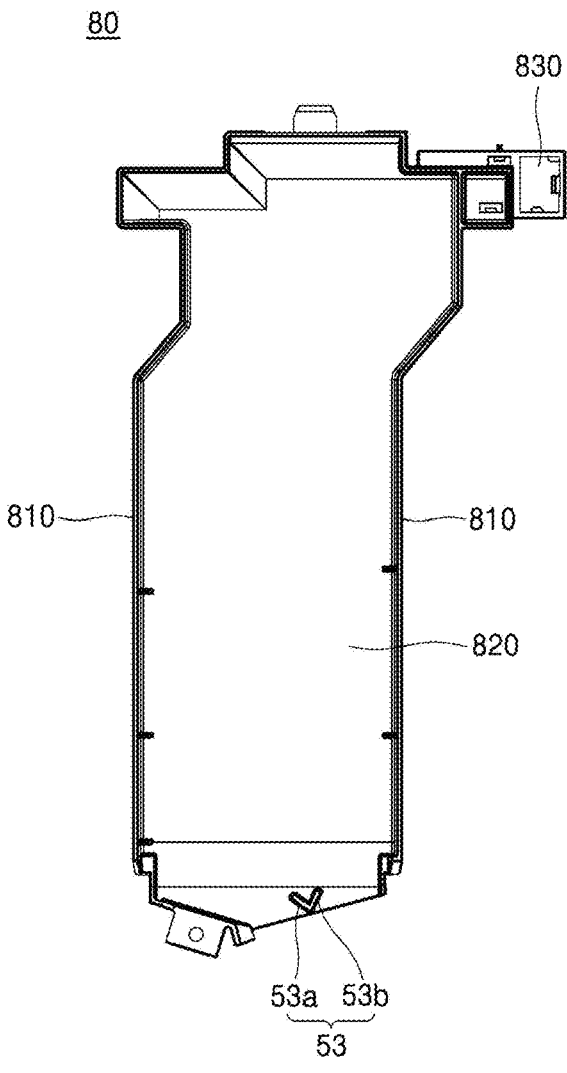
FIG. 21 is a view for describing a vane according to another embodiment.
Figure 22:
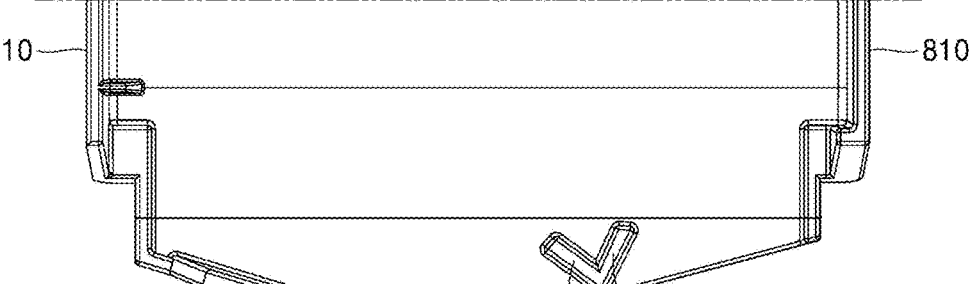
FIG. 22 is a partial enlarged view showing the portion where the vane is disposed in FIG. 21.

FIG. 21 is a view of a vane according to another embodiment. FIG. 22 is a partial enlarged view showing a portion where the vane is disposed in FIG. 21. As illustrated in FIG. 21, the vane 53 according to another embodiment may be integrated with the air guide 80 at the inlet of the air guide 80, and divide the inlet of the air guide 80.

The vane 53 according to yet another embodiment may be integrated with the housing of the air blowing fan 70 at the outlet of the air blowing fan 70, and divide the outlet of the air blowing fan 70. The vane 53 may be selectively provided for the base bracket 50 or the air guide 80 or the air blowing fan.

The vane 53 in FIG. 21 has a similar structure to the vane described with reference to FIGS. 18 to 20, except the vane 53 in FIG. 21 is disposed in a different position. Thus, respective description has been omitted.

Figure 23:
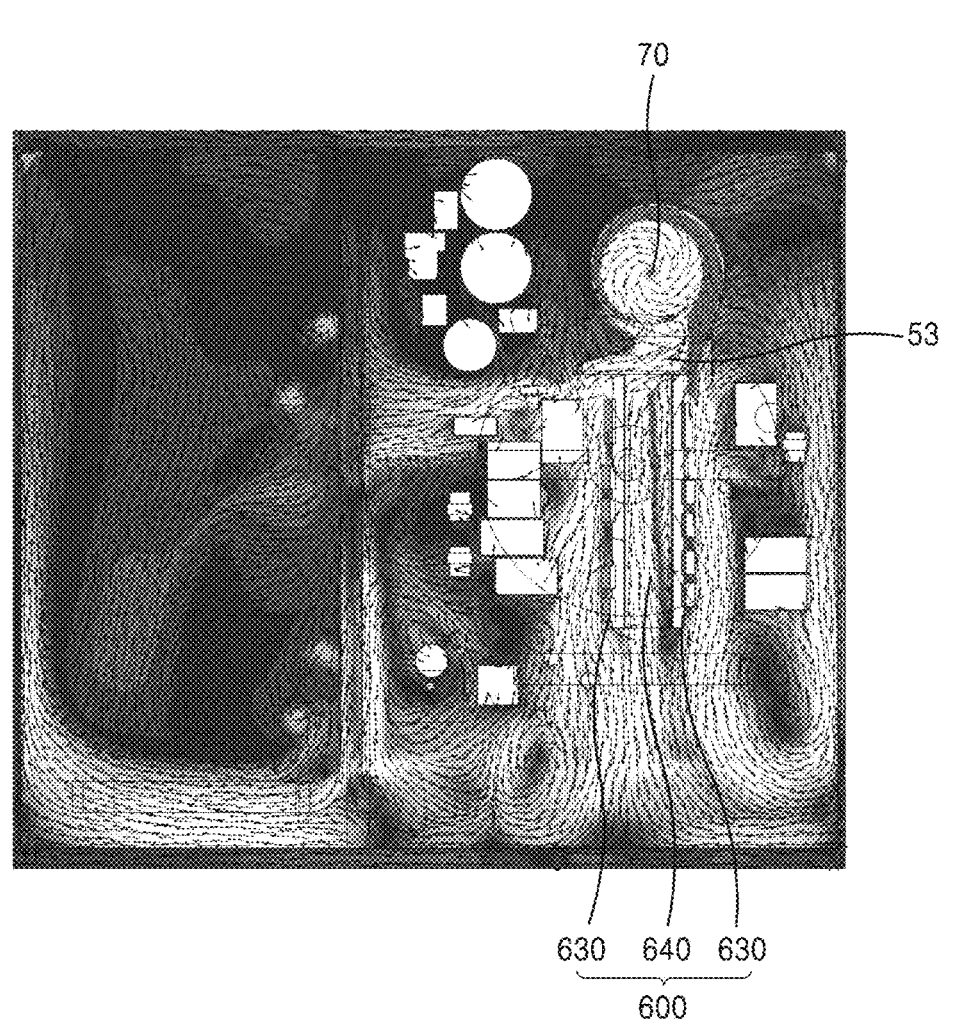
FIG. 23 is an image of air flowing in an air guide and an air blowing fan in a state in which a vane is provided.

FIG. 23 is an image of air flowing in an air guide and an air blowing fan in a state in which a vane is provided. FIG. 23 shows results of simulation based on computer programming.

In FIG. 23, a relatively bright portion shows a relatively high flow velocity of air, and a flow of air blown by the air blowing fan 70. Referring to FIG. 23, air discharge from the air blowing fan 70 is divided in two flow paths by the vane 53 adjacent to the outlet of the air blowing fan 70, and air in each flow path smoothly flows to the slant part 630 disposed on both sides of the heat sink 60. The results of simulation in FIG. 23 clearly show that air discharged from the air blowing fan 70 is divided by the vane 53 and effectively cools the slanted parts 630 while flowing to both of the slanted parts 630.

Embodiments disclosed herein provide an electric range having a structure capable of cooling a heat sink disposed in the electric range effectively. Embodiments disclosed herein further provide an electric range having a structure capable of cooling heat generating elements disposed at a heat sink effectively. Embodiments disclosed herein furthermore provide an electric range having a structure ensuring a uniform flow of air to a heat sink.

Advantages are not limited to the above advantages, and other advantages that are not mentioned above can be clearly understood from the following description and can be more clearly understood from the embodiments set forth herein. Additionally, can be realized via means and combinations thereof that are described in the appended claims.

Embodiments disclosed herein provide an electric range that may include a case, a cover plate coupled to an upper side of the case and allowing an object to be placed thereon, a heating part (heater) that heats the object, the heating part being disposed under the cover plate, an upper bracket that is disposed under the heating part and supports the heating part, a base bracket disposed under the upper bracket and allowing a printed circuit board to be mounted thereon, a heat sink mounted onto the printed circuit board, an air blowing fan that is mounted onto the base bracket and discharges air toward the heat sink through an outlet thereof, and an air guide that communicates with the air blowing fan, surrounds the heat sink, and forms a flow path of air cooling the heat sink. This electric range may include a vane (vane) disposed to divide and guide a flow of the air discharged or being discharged from the air blowing fan.

The air guide may include a first lateral wall and a second lateral wall. A flow space in which air flows may be formed by the first lateral wall and the second lateral wall.

A pair of first lateral walls may be provided, and the first lateral wall may be respectively disposed on both sides of the heat sink. An upper wall may be coupled to the upper end of the pair of first lateral walls to cover the heat sink.

The air guide may include a first area and a second area. The first area and the fourth area may be spaces into which the flow space of air, formed in the air guide, is divided.

The first area may communicate with the air blowing fan, and guide air such that the air flows in the lateral direction of the base bracket. In this case, the heat sink may be disposed in the first area. Air having flown from the air blowing fan to the air guide may flow to the heat sink and cool the heat sink while passing through the first area of the air guide.

The second area may communicate with the first area, bend in the upward-downward direction of the base bracket, and guide air such that the air is discharged outward in a vertical direction, for example, downward. The second area may be formed to face a lower side of the electric range and change a flow direction of air flowing along the air guide. That is, the upper wall of the air guide may bend downward from the second area, and guide air discharged from the second area such that the air flows to the lower portion of the case. In the above-described structure, air discharged from the air blowing fan may flow into the air guide in the frontward-rearward direction of the electric range, and escape from the air guide in the downward direction of the electric range.

The air guide may further comprise a third area which extends from the first area, and changes a flow direction of air having passed through the first area. The first lateral wall of the air guide may bend from the end portion of the first area to have a slant, and form the third area. That is, the first lateral wall may be formed to have a slant in the frontward-rearward direction of the air guide in the third area of the air guide. With this structure, air may flow at a slant in the frontward-rearward direction of the air guide, in the third area.

The air guide may further include a fourth area which extends from the third area, communicates with the second area, and changes a flow direction of air having passed through the third area. The first lateral wall of the air guide may bend from the end portion of the third area to have a slant, and form the fourth area. That is, the first lateral wall may be formed to have a slant with respect to the first lateral wall of the third area at an outlet of the third area of the air guide. With this structure, a flow direction of air of the air guide may change again to the frontward-rearward direction of the air guide, in the fourth area.

A lengthwise direction of the heat sink may be in parallel with a direction in which air passing through the air guide flows. With this structure, a contact surface area and time for contact between the heat sink and the air flow may increase, thereby enhance cooling efficiency of the heat sink.

The heat sink may include a plurality of cooling fins. The plurality of cooling fins may protrude downward from the lower surface of the heat sink, and be formed in a direction parallel with the lengthwise direction of the heat sink.

The heat sink may be provided with a flow channel that passes through the heat sink in the lengthwise direction thereof to form a flow path of air. The flow channel may be formed in the lengthwise direction of the heat sink, and pass through a plane part or portion of the heat sink.

The heat sink may include a slanted part or portion and the plane part or portion. The slanted part may be disposed on both sides of the heat sink and have an upper surface that is inclined. The plane part may be formed at a center of the heat sink, have the flow channel, and have an upper surface that is flat.

All or some of the heat generating elements included in the printed circuit board may be mounted onto the upper surface of the slanted part. Accordingly, air blown by the air blowing fan may cool the heat generating elements mounted onto the slanted part of the heat sink, and effectively suppress overheating of the printed circuit board.

The base bracket may include a first vent part (vent) that is formed in a portion corresponding to the air blowing fan, and a second vent part (vent) that is formed in a portion corresponding to the fourth area. In this case, the first vent part may have a shape corresponding to a shape of the air blowing fan, and the second vent part may have a shape corresponding to a shape of the fourth area.

The case may be provided with a first penetration hole and a second penetration hole to effectively introduce and discharge air blown by the air blowing fan. The first penetration hole may be formed in a portion corresponding to the first vent part, and the second penetration hole may be formed in a portion corresponding to the second vent part. The first penetration hole and the second penetration hole may be formed in such a way that the first casing forming the bottom surface of the case is penetrated.

The vane may be disposed to divide and guide flow of air discharged from the air blowing fan. The flow of the air discharged from the air blowing fan may be divided into two by the vane disposed near an inlet of the air guide, and a flow direction of the air may be guided such that the air flows into the flow space in the air guide.

The vane may include a first vane and a second vane to divide a flow of air. The first vane and the second vane may protrude toward the heat sink, and the first vane may be spaced further from the second vane toward the heat sink.

That is, the first vane may protrude toward the heat sink, and the second vane may separate from the first vane and protrude toward the heat sink. Additionally, a distance between the first vane and the second vane may become greater further toward the heat sink.

The vane may be provided to divide a cross section of the outlet of the air blowing fan. Further, the vane may be disposed in a portion where a portion of a high air flow rate has a relatively small area, while a portion of a low flow rate has a relatively large area, in the cross section of the outlet of the air blowing fan. The vane may be formed to protrude upward from the base bracket. Further, the vane may be disposed between the air blowing fan and the air guide.

Alternatively, the vane may be integrated with the air guide at an inlet of the air guide, or with the air blowing fan at the outlet of the air blowing fan.

Embodiments disclosed herein provide an electric range that may include a case, at least one heating part (heater) disposed in the case and heating an object to be heated, a base bracket disposed under the heating part and allowing a printed circuit board to be mounted thereon, a heat sink mounted onto the printed circuit board, an air blowing fan that is mounted onto the base bracket and discharges air toward the heat sink, an air guide that communicates with the air blowing fan, surrounds the heat sink, and forms a flow path of air cooling the heat sink, and a vane (vane) disposed in a portion where the air blowing fan and the air guide communicate and guiding flow of air discharged from the air blowing fan. The vane may include a first vane that protrudes toward the heat sink, and a second vane that separate from the first vane and protrudes toward the heat sink, where a distance between the first vane and the second vane becomes greater further toward the heat sink.

In the electric range according to embodiments disclosed herein, when the heat generating elements are disposed symmetrically on both sides of the heat sink with respect to the center of the heat sink, air may flow to both sides of the heat sink evenly. Further, air discharged from the air blowing fan may be divided into two flow paths by the first vane and the second vane, and air in each of the flow paths may flow to the slanted part disposed on both sides of the heat sink and evenly cool each of the slanted parts. With this structure, the heat generating elements disposed on each slanted part may be cooled evenly and efficiently.

Furthermore, as the vane divides the cross section of the outlet of the air blowing fan into areas having different surface areas, each of the flow paths divided by the vane may have a similar flow rate, enabling air to uniformly flow to the pair of slanted parts disposed on both sides of the heat sink. Thus, cooling efficiency of the heat sink and the heat generating elements disposed on the heat sink may improve.

An electric range of another embodiment may include an air blowing fan discharging air, a vane being disposed to divide and guide a flow of the air discharged or being discharged from the air blowing fan, and a heat sink being mounted onto a printed circuit board. The vane may include a first vane protruding toward the heat sink, and a second vane separating from the first vane and protruding toward the heat sink, wherein a distance between the first vane and the second vane becomes greater further toward the heat sink.

Embodiments are described above with reference to a number of illustrative embodiments thereof. However, embodiments are not limited to the embodiments and drawings set forth herein, and numerous other modifications and embodiments can be devised by one skilled in the art within the technical scope of the disclosure. Further, the effects and predictable effects based on the configurations in the disclosure are to be included within the range of the disclosure though not explicitly described in the description of the embodiments.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section could be termed a second element, component, region, layer or section without departing from the teachings of the present invention.

Spatially relative terms, such as "lower", "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" relative to the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Any reference in this specification to "one embodiment," "an embodiment," "example embodiment," etc., means that a particular feature, structure, or characteristic described in connection with the embodiment is included in at least one embodiment. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An electric range, comprising:

a case;

a cover plate coupled to an upper side of the case, on which an object to be heated is placed;

an air blowing fan that discharges air;

an air guide that communicates with the air blowing fan, and forms a flow path of air; and a vane that divides and guides a flow of the air discharged from the air blowing fan, wherein the vane is disposed in a portion where a portion of the flow of air having a relatively higher air flow rate has a relatively small area, while a portion of the flow of air having a relatively lower air flow rate has a relatively large area, in a cross-section of an outlet of the air blowing fan.

2. The electric range of claim 1, further comprising:

at least one heater that heats the object, the at least one heater being disposed under the cover plate;

an upper bracket that is disposed under the at least one heater and supports the at least one heater;

a base bracket disposed under the upper bracket, on which a printed circuit board is mounted; and a heat sink mounted on the printed circuit board, and wherein the vane comprises:

a first vane that protrudes toward the heat sink; and a second vane that is separate from the first vane and protrude toward the heat sink, wherein a distance between the first vane and the second vane increases in a direction toward the heat sink.

3. The electric range of claim 1, wherein the vane divides the cross-section of the outlet of the air blowing fan.

4. The electric range of claim 2, wherein the air guide comprises:

a first area that communicates with the air blowing fan and guides air such that the air flows in a lateral direction of the base bracket; and a second area that communicates with the first area, is bent in an upward-downward direction of the base bracket, and guides air such that the air is discharged in a vertical direction.

5. The electric range of claim 4, wherein the air guide comprises:

a pair of first lateral walls that forms at least the first area and is disposed on both sides of the heat sink respectively; and an upper wall that forms at least the first area, is coupled to upper ends of the pair of first lateral walls, and covers the heat sink.

6. The electric range of claim 5, wherein the air guide further comprises:

a third area that extends from the first area and is bent from an end portion of the first area to change a flow direction of air having passed through the first area, wherein the third area is formed in such a way that a portion of the first lateral walls forming the third area is slanted; and a fourth area that extends from the third area, and is bent from an end portion of the third area, and wherein the fourth area is formed in such a way that a portion of the first lateral walls forming the fourth area is slanted.

7. The electric range of claim 6, wherein the upper wall is bent downward in the second area such that the air guide guides air discharged from the second area to a lower portion of the case.

8. The electric range of claim 5, wherein the base bracket comprises:

a first vent formed in a portion corresponding to the air blowing fan; and a second vent formed in a portion corresponding to the fourth area.

9. The electric range of claim 2, wherein a lengthwise direction of the heat sink extends in parallel with a direction in which air passes through the air guide.

10. The electric range of claim 9, wherein the heat sink comprises a plurality of cooling fins that protrudes downward from a lower surface thereof and extends in a direction parallel with the lengthwise direction of the heat sink.

11. The electric range of claim 10, wherein the heat sink is provided with a flow channel that passes through the heat sink in the lengthwise direction of the heat sink and forms a flow path of air.

12. The electric range of claim 11, wherein the heat sink comprises:

a slanted portion disposed on both sides of the heat sink and having a slanted upper surface; and a plane portion formed at a center of the heat sink, having the flow channel formed therein, and having a flat upper surface.

13. The electric range of claim 12, wherein the vane protrudes upward from the base bracket.

14. The electric range of claim 13, wherein the vane is disposed between the air blowing fan and the air guide.

15. The electric range of claim 12, wherein the vane is integrated with the air guide at an inlet of the air guide, or with the air blowing fan at the outlet of the air blowing fan.

16. An electric range, comprising:

a case;

a cover plate coupled to an upper side of the case, on which an object to be heated is placed;

at least one heater that heats the object, the at least one heater being disposed under the cover plate;

an upper bracket that is disposed under the at least one heater and supports the at least one heater;

a base bracket disposed under the upper bracket, on which a printed circuit board is mounted;

a heat sink mounted on the printed circuit board;

an air blowing fan that is mounted on the base bracket and discharges air toward the heat sink through an outlet thereof;

an air guide that communicates with the air blowing fan, surrounds the heat sink, and forms a flow path of air cooling the heat sink; and a pair of vanes that divides and guides a flow of the air discharged from the air blowing fan and flowing toward the heat sink, wherein a distance between the pair of vanes increases toward the heat sink, and wherein the pair of vanes is disposed in a portion where a portion of the flow of air having a relatively higher air flow rate has a relatively small area, while a portion of the flow of air having a relatively lower air flow rate has a relatively large area, in a cross-section of the outlet of the air blowing fan.

17. The electric range of claim 16, wherein a lengthwise direction of the heat sink extends in parallel with a direction in which air passes through the air guide.

18. An electric range, comprising:

a case;

a cover plate coupled to an upper side of the case, on which an object to be heated is placed;

at least one heater that heats the object, the at least one heater being disposed under the cover plate;

an upper bracket that is disposed under the at least one heater and supports the at least one heater;

a base bracket disposed under the upper bracket, on which a printed circuit board is mounted;

a heat sink mounted on the printed circuit board;

an air blowing fan that is mounted on the base bracket and discharges air toward the heat sink through an outlet thereof;

an air guide that communicates with the air blowing fan, surrounds the heat sink, and forms a flow path of air cooling the heat sink; and a pair of vanes that divides and guides a flow of the air discharged from the air blowing fan and flowing toward the heat sink, wherein a first vane of the pair of vanes extends at a first angle with respect to a lengthwise direction of the heat sink and a second vane of the pair of vanes extends at a second angle with respect to the lengthwise direction of the heat sink, wherein the second angle is greater than the first angle, and wherein the pair of vanes is disposed in a portion where a portion of the flow of air having a relatively higher air flow rate has a relatively small area, while a portion of the flow of air having a relatively lower air flow rate has a relatively large area, in a cross-section of the outlet of the air blowing fan.

19. The electric range of claim 18, wherein a lengthwise direction of the heat sink extends in parallel with a direction in which air passes through the air guide.

\* \* \* \* \*